(12) United States Patent
Bark et al.

(10) Patent No.: US 10,497,649 B2
(45) Date of Patent: Dec. 3, 2019

(54) INTEGRATED CIRCUIT DEVICE AND METHOD OF MANUFACTURING THE SAME

(71) Applicant: SAMSUNG ELECTRONICS CO., LTD., Suwon-si, Gyeonggi-Do (KR)

(72) Inventors: Su-Hyun Bark, Suwon-si (KR); Sang-Hoon Ahn, Goyang-si (KR); Young-Bae Kim, Seoul (KR); Hyeok-Sang Oh, Suwon-si (KR); Woo-Jin Lee, Hwaseong-si (KR); Hoon-Seok Seo, Suwon-si (KR); Sung-Jin Kang, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/831,603

(22) Filed: Dec. 5, 2017

(65) Prior Publication Data

US 2018/0261546 A1 Sep. 13, 2018

(30) Foreign Application Priority Data

Mar. 8, 2017 (KR) ........................ 10-2017-0029609

(51) Int. Cl.
*H01L 23/48* (2006.01)
*H01L 23/532* (2006.01)
(Continued)

(52) U.S. Cl.
CPC .. *H01L 23/53238* (2013.01); *H01L 21/31111* (2013.01); *H01L 21/7682* (2013.01);
(Continued)

(58) Field of Classification Search
CPC .......... H01L 23/53238; H01L 23/5226; H01L 23/5283; H01L 23/53204; H01L 23/53295;
(Continued)

(56) References Cited

U.S. PATENT DOCUMENTS 5,814,555 A 9/1998 Bandyopadhyay et al.
6,531,783 B1 3/2003 Kalnitsky
(Continued)

FOREIGN PATENT DOCUMENTS

KR 10-2008-0109281 12/2008

OTHER PUBLICATIONS

US NOA dated Dec. 13, 2018 in Related U.S. Appl. No. 15/846,498.
U.S. Office Action dated Aug. 1, 2018 in Related U.S. Appl. No. 15/846,498.

*Primary Examiner* — Hoa B Trinh
(74) *Attorney, Agent, or Firm* — F. Chau & Associates, LLC

(57) ABSTRACT

An integrated circuit device includes a metal film and a complex capping layer covering a top surface of the metal film. The metal film includes a first metal, and penetrates at least a portion of an insulating film formed over a substrate. The complex capping layer includes a conductive alloy capping layer covering the top surface of the metal film, and an insulating capping layer covering a top surface of the conductive alloy capping layer and a top surface of the insulating film. The conductive alloy capping layer includes a semiconductor element and a second metal different from the first metal. The insulating capping layer includes a third metal.

15 Claims, 36 Drawing Sheets

(51) Int. Cl.
  *H01L 29/16* (2006.01)
  *H01L 21/311* (2006.01)
  *H01L 21/768* (2006.01)
  *H01L 23/528* (2006.01)
  *H01L 23/522* (2006.01)
  *H01L 23/485* (2006.01)
  *H01L 29/78* (2006.01)

(52) U.S. Cl.
  CPC .... *H01L 21/7685* (2013.01); *H01L 21/76802* (2013.01); *H01L 21/76805* (2013.01); *H01L 21/76832* (2013.01); *H01L 21/76834* (2013.01); *H01L 21/76846* (2013.01); *H01L 21/76849* (2013.01); *H01L 21/76856* (2013.01); *H01L 21/76858* (2013.01); *H01L 21/76864* (2013.01); *H01L 21/76877* (2013.01); *H01L 21/76886* (2013.01); *H01L 23/485* (2013.01); *H01L 23/5226* (2013.01); *H01L 23/5283* (2013.01); *H01L 23/53204* (2013.01); *H01L 23/53266* (2013.01); *H01L 23/53295* (2013.01); *H01L 29/16* (2013.01); *H01L 23/53252* (2013.01); *H01L 29/785* (2013.01)

(58) Field of Classification Search
  CPC ......... H01L 23/53252; H01L 23/53266; H01L 21/7685; H01L 21/76846; H01L 21/76856; H01L 21/76864; H01L 21/76834; H01L 21/76877; H01L 21/76802; H01L 21/31111
  See application file for complete search history.

(56) References Cited

U.S. PATENT DOCUMENTS

| | | | |
|---|---|---|---|
| 6,888,247 | B2 | 5/2005 | Lee et al. |
| 7,268,087 | B2 | 9/2007 | Aoki et al. |
| 7,361,991 | B2 | 4/2008 | Saenger et al. |
| 7,846,841 | B2 | 12/2010 | Ishizaka et al. |
| 7,910,476 | B2 | 3/2011 | Fang et al. |
| 8,017,519 | B2 | 9/2011 | Ishikawa |
| 8,120,179 | B2 | 2/2012 | Chanda et al. |
| 8,143,162 | B2 | 3/2012 | Yu et al. |
| 8,384,217 | B2 | 2/2013 | Streck et al. |
| 8,749,058 | B2 | 6/2014 | Usami et al. |
| 9,041,216 | B2 | 5/2015 | Sung et al. |
| 9,269,612 | B2 | 2/2016 | Chen et al. |
| 9,305,836 | B1 | 4/2016 | Gates et al. |
| 9,425,144 | B2 | 8/2016 | Bonilla et al. |
| 9,437,484 | B2 * | 9/2016 | JangJian ........... H01L 23/53238 |
| 2005/0087871 | A1 * | 4/2005 | Abe ................. H01L 21/76829 257/751 |
| 2006/0073695 | A1 | 4/2006 | Filippi et al. |
| 2008/0174017 | A1 | 7/2008 | Yang et al. |
| 2009/0072409 | A1 | 3/2009 | Nitta et al. |
| 2010/0025852 | A1 | 2/2010 | Ueki et al. |
| 2014/0273438 | A1 | 9/2014 | Ye et al. |
| 2014/0299989 | A1 | 10/2014 | Lim et al. |
| 2015/0014759 | A1 | 1/2015 | Lee et al. |
| 2015/0137375 | A1 | 5/2015 | Chen et al. |
| 2015/0179499 | A1 | 6/2015 | Yang et al. |
| 2016/0071801 | A1 | 3/2016 | Lin et al. |
| 2016/0133512 | A1 | 5/2016 | Lee et al. |

* cited by examiner

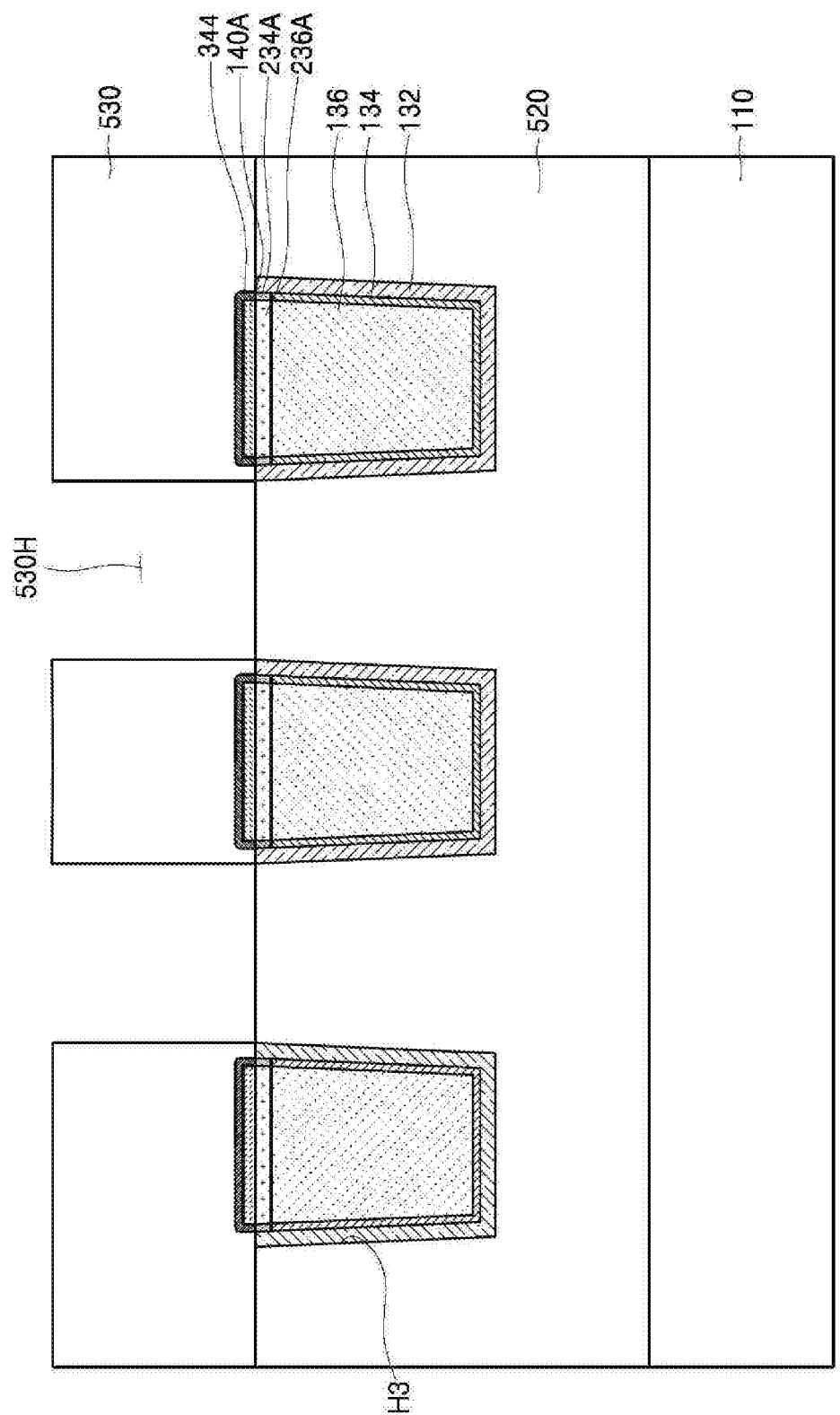

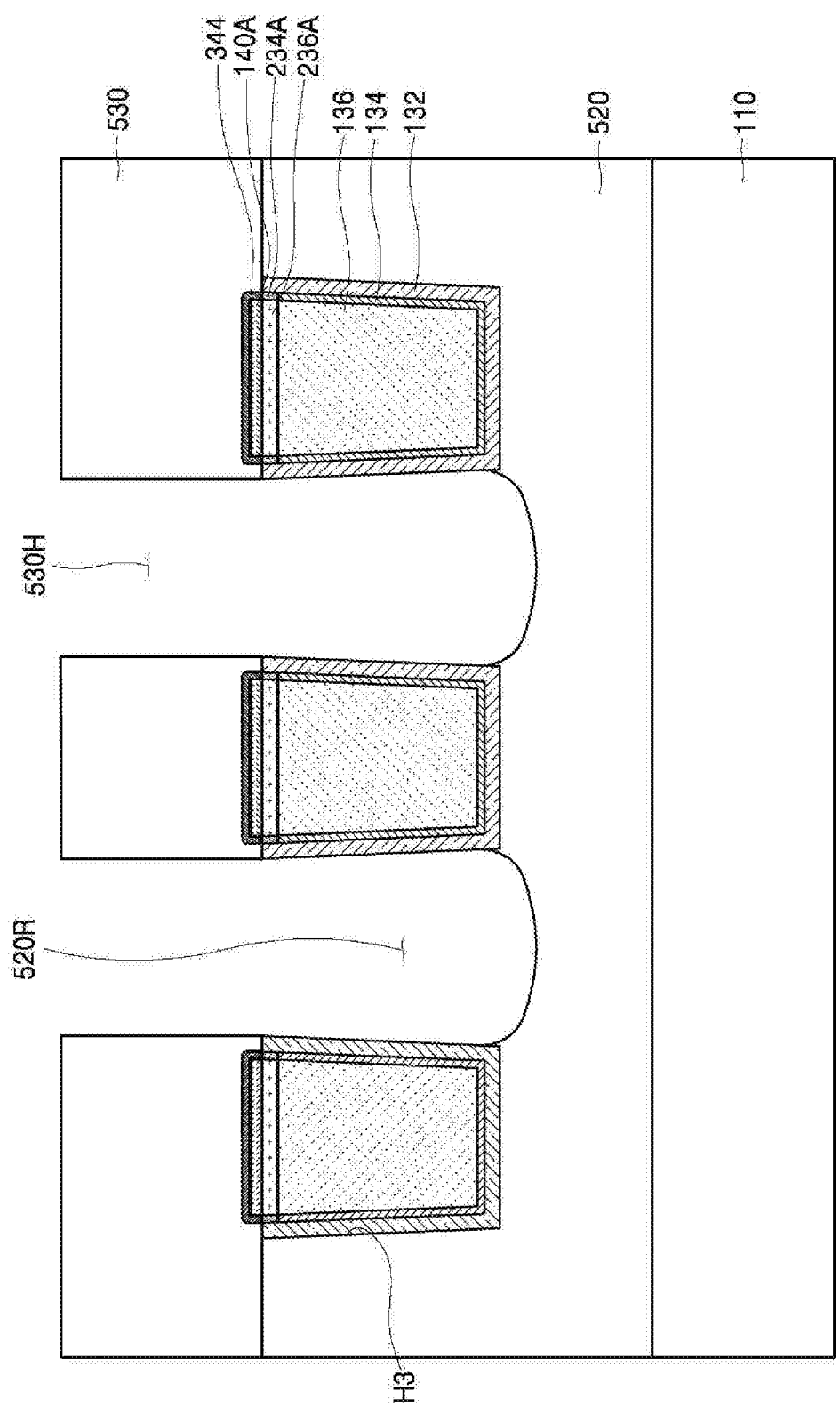

INTEGRATED CIRCUIT DEVICE AND METHOD OF MANUFACTURING THE SAME

CROSS-REFERENCE TO RELATED APPLICATIONS

This application claims priority under 35 U.S.C. § 119 to Korean Patent Application No. 10-2017-0029609, filed on Mar. 8, 2017, the disclosure of which is incorporated by reference herein in its entirety.

TECHNICAL FIELD

Exemplary embodiments of the inventive concept relate to an integrated circuit device and a method of manufacturing the same, and more particularly, to an integrated circuit device that includes a metal wiring layer, and a method of manufacturing the integrated circuit device.

DISCUSSION OF THE RELATED ART

As technology advances, integrated circuit devices are quickly becoming more downscaled. Accordingly, line widths and pitches of metal wiring layers included in the integrated circuit devices are being reduced. In this regard, suppressing resistance increases and current leakages of the metal wiring layers, and suppressing electromigration of metals, may prevent or reduce time-dependent dielectric breakdown (TDDB) of the integrated circuit devices, thereby increasing the reliability and lifespan of the integrated circuit devices.

SUMMARY

Exemplary embodiments of the inventive concept provide an integrated circuit device having a metal wiring structure capable of improving reliability by suppressing a resistance increase and a current leakage of metal wiring layers, and by suppressing electromigration of a metal.

Exemplary embodiments of the inventive concept provide a method of manufacturing an integrated circuit device having a metal wiring structure capable of improving reliability by suppressing a resistance increase and a current leakage of metal wiring layers, and by suppressing electromigration of a metal.

According to an exemplary embodiment of the inventive concept, an integrated circuit device includes a metal film including a first metal and penetrating at least a portion of an insulating film formed over a substrate, and a complex capping layer covering a top surface of the metal film. The complex capping layer includes a conductive alloy capping layer covering the top surface of the metal film. The conductive alloy capping layer includes a semiconductor element and a second metal different from the first metal. The complex capping layer further includes an insulating capping layer including a third metal. The insulating capping layer covers a top surface of the conductive alloy capping layer and a top surface of the insulating film.

According to an exemplary embodiment of the inventive concept, an integrated circuit device includes a metal film including a first metal and penetrating at least a portion of an insulating film formed over a substrate, and a complex capping layer covering a top surface of the metal film. The complex capping layer includes a first conductive alloy capping layer including a first semiconductor element and a second metal different from the first metal, a second conductive alloy capping layer including the first metal and a second semiconductor element and disposed between the metal film and the first conductive alloy capping layer, and an insulating capping layer covering the insulating film and the first conductive alloy capping layer.

According to an exemplary embodiment of the inventive concept, an integrated circuit device includes a first insulating film formed over a substrate, a plurality of conductive layers penetrating at least a portion of the first insulating film, and a second insulating film formed over the first insulating film and the plurality of conductive layers. Each of the plurality of conductive layers includes a metal film including a first metal, a conductive barrier film surrounding a bottom surface and a side wall of the metal film, and a complex capping layer covering a top surface of the metal film and a top surface of the conductive barrier film. The complex capping layer includes a first conductive alloy capping layer including a first semiconductor element and a second metal different from the first metal, a second conductive alloy capping layer including the first metal and a second semiconductor element and disposed between the metal film and the first conductive alloy capping layer, and an insulating capping layer covering the first insulating film and the first conductive alloy capping layer. An air gap surrounded by the insulating capping layer and the second insulating film is disposed between two neighboring conductive layers from among the plurality of conductive layers.

According to an exemplary embodiment of the inventive concept, a method of manufacturing an integrated circuit device includes forming a first hole by etching an insulating film disposed on a substrate. The method further includes forming, inside the first hole, a metal film including a first metal. The method further includes forming, over the metal film, a first conductive capping layer including a second metal different from the first metal. The method further includes forming, from the first conductive capping layer, a first conductive alloy capping layer including a first semiconductor element by annealing the first conductive capping layer under a gas environment including the first semiconductor element. The method further includes forming, over the first conductive alloy capping layer and the insulating film, an insulating capping layer including a second metal.

BRIEF DESCRIPTION OF THE DRAWINGS

The above and other features of the present inventive concept will become more apparent by describing in detail exemplary embodiments thereof with reference to the accompanying drawings, in which:

FIGS. 16A through 16E are cross-sectional views illustrating a method of manufacturing an integrated circuit device, according to an exemplary embodiment of the inventive concept.

DETAILED DESCRIPTION OF THE EXEMPLARY EMBODIMENTS

Figure 1:
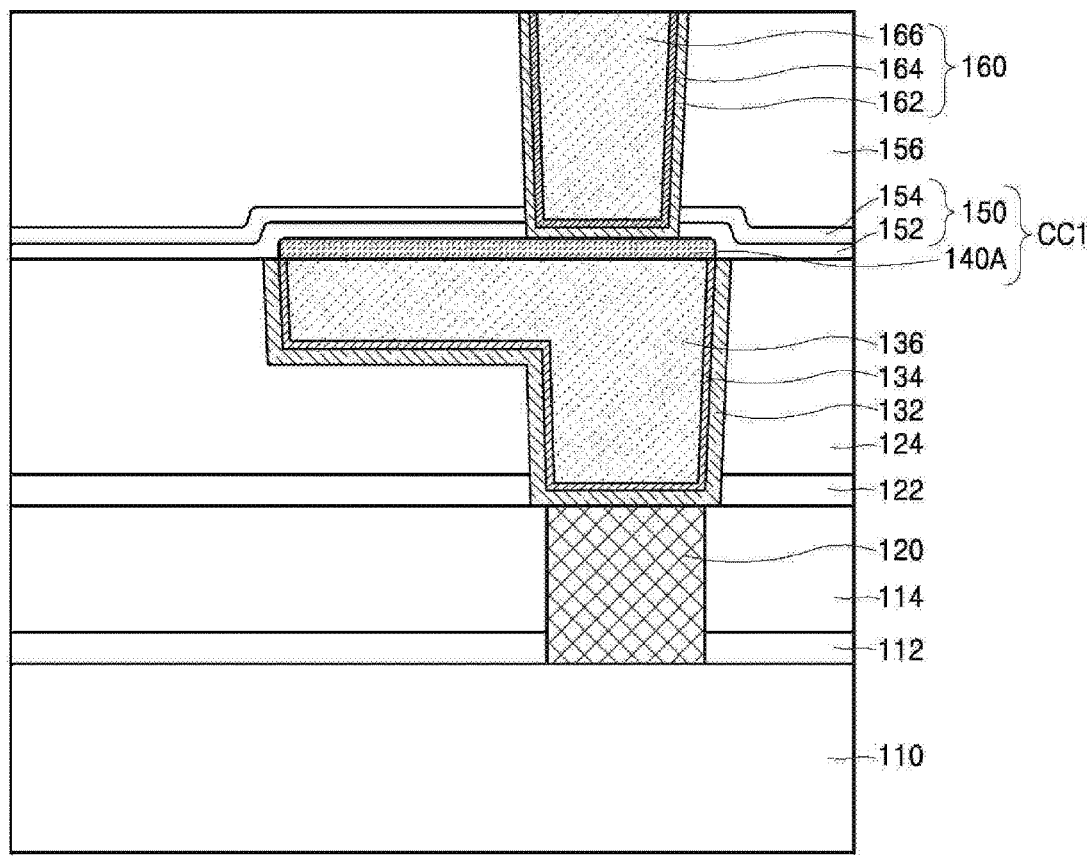
FIGS. 1 through 10 are cross-sectional views of components of integrated circuit devices, according to exemplary embodiments of the inventive concept.

Exemplary embodiments of the inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" or "surrounding" another component, it can be the only component covering or surrounding the other component, or one or more intervening components may also be covering or surrounding the other component.

It will be further understood that when a component is described as surrounding or covering another component, the component may entirely or partially surround or cover the other component, in accordance with the illustration of the components in the drawings.

It will be further understood that the terms "first," "second," "third," etc. are used herein to distinguish one element from another, and the elements are not limited by these terms. Thus, a "first" element in an exemplary embodiment may be described as a "second" element in another exemplary embodiment.

FIG. 1 is a cross-sectional view of components of an integrated circuit device 100, according to an exemplary embodiment of the inventive concept.

Referring to FIG. 1, an integrated circuit device 100 includes a metal film 136. The metal film 136 includes a first metal and penetrates at least a portion of a first insulating film 124 formed over a substrate 110. The integrated circuit device 100 further includes a complex capping layer CC1 covering a top surface of the metal film 136.

The complex capping layer CC1 includes a first conductive alloy capping layer 140A including a second metal and a first semiconductor element, and an insulating capping layer 150 covering the first conductive alloy capping layer 140A. The insulating capping layer 150 is spaced apart from the metal film 136. The first conductive alloy capping layer 140A is disposed between the insulating capping layer 150 and the metal film 136. The term "alloy" used herein means a material formed of a combination of different types of metals or a material formed of a combination of a metal and an element other than a metal.

According to an exemplary embodiment, the first metal may be copper (Cu), tungsten (W), cobalt (Co), ruthenium (Ru), manganese (Mn), titanium (Ti), or tantalum (Ta). The metal film 136 may be formed of Cu, W, Co, Ru, Mn, Ti, or Ta. The second metal is a metal different from the first metal. For example, the second metal may be Co, nickel (Ni), Ta, Ru, W, Mn, or a combination thereof. The first conductive alloy capping layer 140A may be formed of a metal or an alloy. The first semiconductor element may be at least one of silicon (Si) or germanium (Ge).

According to an exemplary embodiment, the first conductive alloy capping layer 140A is formed of a material represented by $M_xA_y$, wherein M denotes a metal, A denotes Si or Ge, x denotes an integer from 1 to 6, and y denotes an integer from 1 to 10. For example, the first conductive alloy capping layer 140A may be formed of CoSi, $CoSi_2$, $Co_2Si$, $Co_3Si$, CoGe, $CoGe_2$, $CoSGe_3$, $Co_5Ge_7$, or $Co_4Ge$. However, the first conductive alloy capping layer 140A is not limited thereto.

In an exemplary embodiment, the insulating capping layer 150 has a multilayered structure including a first insulating capping layer 152 that includes a metal, and a second insulating capping layer 154 that does not include a metal. The first insulating capping layer 152 may be formed of, for example, aluminum nitride (AlN), aluminum oxynitride (AlON), aluminum oxide (AlO), or aluminum oxycarbide (AlOC). The second insulating capping layer 154 may be formed of, for example, silicon carbide (SiC), silicon nitride (SiN), nitrogen-doped silicon carbide (SiC:N), or silicon oxycarbide (SiOC).

In an exemplary embodiment, a bottom surface and a side wall of the metal film 136 are surrounded by a conductive barrier film 132. The conductive barrier film 132 may include a third metal that is different from the first and second metals. The third metal may be, for example, Ta or Ti. For example, the conductive barrier film 132 may be formed of Ta, TaN, Ti, TiN, or a combination thereof. In an exemplary embodiment, the first conductive alloy capping layer 140A extends to cover a top surface of the metal film 136 and an uppermost surface of the conductive barrier film 132. In an exemplary embodiment, a metal liner 134 is disposed between the metal film 136 and the conductive barrier film 132. According to an exemplary embodiment, the metal liner 134 may be formed of the second metal. For example, the metal liner 134 may be a Co liner or a Ta liner. For example, in an exemplary embodiment, when the first conductive alloy capping layer 140A includes Co, the metal liner 134 is a Co liner. However, exemplary embodiments of the inventive concept are not limited thereto.

In an exemplary embodiment, the substrate 110 includes a semiconductor, such as Si or Ge, or a compound semiconductor, such as SiTGe, SiC, gallium arsenide (GaAs), indium arsenide (InAs), or indium phosphide (InP). In an exemplary embodiment, the substrate 110 includes a conductive region. In an exemplary embodiment, the conductive region includes an impurity-doped well, an impurity-doped structure, or a conductive layer. The substrate 110 may include circuit devices such as, for example, a gate structure, an impurity region, and a contact plug.

In an exemplary embodiment, a first etch-stop layer 112, a lower insulating film 114, and a lower conductive film 120 penetrating the lower insulating film 114 and the first etch-stop layer 112 are disposed over the substrate 110. In an exemplary embodiment, the first etch-stop layer 112 is formed of a material having an etch selectivity different from the lower insulating film 114. For example, the first etch-stop layer 112 may be formed of a SiN layer, a carbon-doped SiN layer, or a carbon-doped SiON layer. According to an exemplary embodiment, the first etch-stop layer 112 includes a metal nitride layer, such as an AlN layer. According to an exemplary embodiment, the lower insulating film 114 is a silicon oxide film. For example, the lower insulating film 114 may be formed of a silicon oxide-based material, such as plasma-enhanced oxide (PEOX), tetraethyl orthosilicate (TEOS), boro TEOS (BTEOS), phosphorous TEOS (PTEOS), boro phospho TEOS (BPTEOS), boro silicate glass (BSG), phospho silicate glass (PSG), or boro phospho silicate glass (BPSG). According to an exemplary embodiment, the lower insulating film 114 is a low dielectric film having a low dielectric constant K from about 2.2 to about 3.0, such as, for example, a SiOC film or a SiCOH film. In an exemplary embodiment, the lower conductive film 120 is a wiring layer including a metal film and a conductive barrier film surrounding the metal film. The metal film may be formed of, for example, Cu, W, Al, or Co. The conductive barrier film may be formed of, for example, Ta, TaN, Ti, TiN, or a combination thereof. According to an exemplary embodiment, the lower conductive film 120 is electrically connected to the conductive region of the substrate 110. According to an exemplary embodiment, the lower conductive film 120 is connected to a source/drain region or a gate electrode of a transistor disposed in the substrate 110.

In an exemplary embodiment, a second etch-stop film 122 and the first insulating film 124 are sequentially disposed over the lower insulating film 114. In addition, the metal film 136, the conductive barrier film 132, and the metal liner 134 extend to the lower conductive film 120 after penetrating the first insulating film 124 and the second etch-stop film 122. In an exemplary embodiment, the conductive barrier film 132 contacts the lower conductive film 120. As shown in FIG. 1, the conductive barrier film 132 and the metal liner 134 surround the bottom surface and side wall of the metal film 136. The materials that form the second etch-stop film 122 and the first insulating film 124 are the same or similar to those of the first etch-stop layer 112 and the lower insulating film 114 described above.

In an exemplary embodiment, the integrated circuit device 100 includes an upper wiring layer 160 that penetrates a second insulating film 156 that covers the complex capping layer CC1, and that penetrates at least a portion of the complex capping layer CC1 so as to be electrically connected to the metal film 136. A material that forms the second insulating film 156 is the same as or similar to that of the lower insulating film 114 described above. In an exemplary embodiment, the upper wiring layer 160 includes a metal film 166, as well as a conductive barrier film 162 and a metal liner 164 that cover a bottom surface and a side wall of the metal film 166. Details regarding the conductive barrier film 162, the metal liner 164, and the metal film 166 are the same as or similar to the conductive barrier film 132, the metal liner 134, and the metal film 136 described above.

As shown in FIG. 1, in an exemplary embodiment, the upper wiring layer 160 contacts a top surface of the first conductive alloy capping layer 140A by penetrating the insulating capping layer 150 of the complex capping layer CC1. However, the location and the form of the upper wiring layer 160 may vary, and are not limited thereto.

In an exemplary embodiment, the metal film 136 is covered by the complex capping layer CC1, which includes the first conductive alloy capping layer 140A and the insulating capping layer 150, which are sequentially formed on the metal film 136. A resistance increase and a current leakage of the metal film 136 may be suppressed by the complex capping layer CC1, and electromigration of a metal from the metal film 136 may be suppressed. Thus, according to exemplary embodiments of the inventive concept, reliability of a wiring structure including the metal film 136 may be improved.

Figure 2:
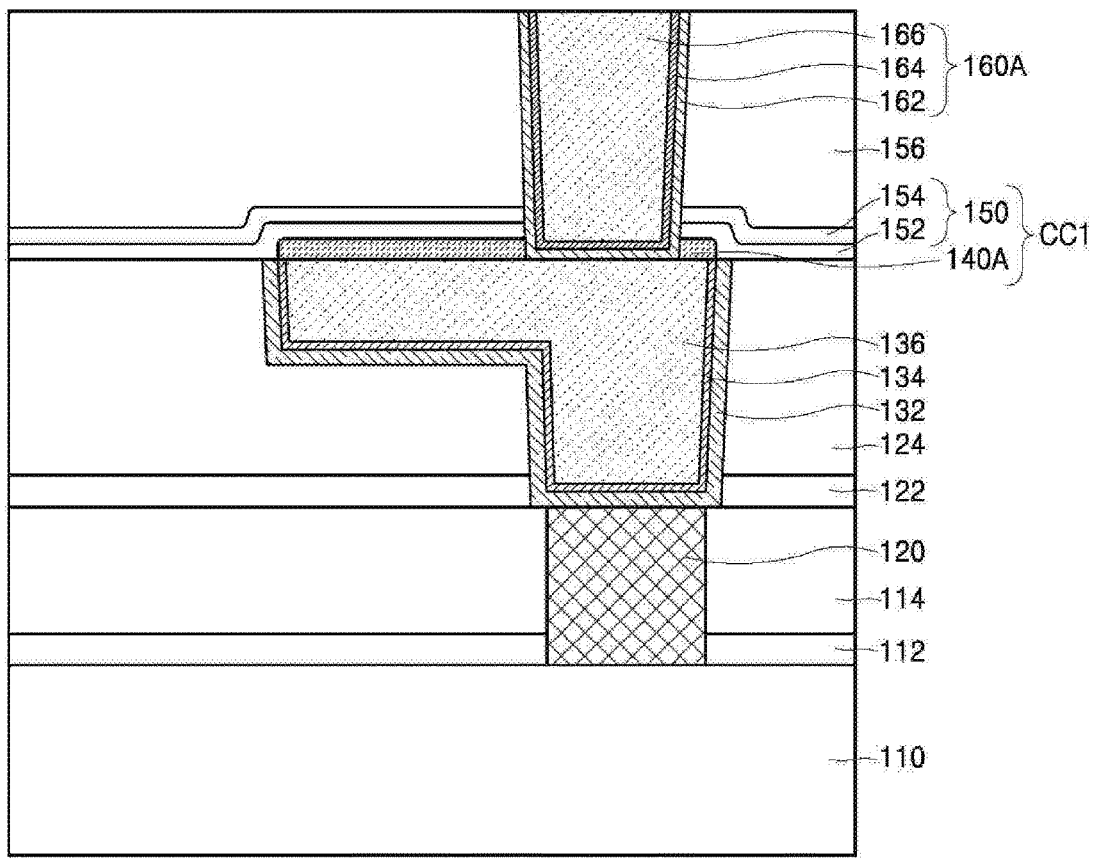

FIG. 2 is a cross-sectional view of components of an integrated circuit device 100A, according to an exemplary embodiment of the inventive concept.

Referring to FIG. 2, the structure of the integrated circuit device 100A is substantially the same as the structure of the integrated circuit device 100 of FIG. 1. However, the integrated circuit device 100A includes an upper wiring layer 160A that contacts the metal film 136 by penetrating the insulating capping layer 150 and the first conductive alloy capping layer 140A that form the complex capping layer CC1. Details regarding the upper wiring layer 160A are the same as or similar to those of the upper wiring layer 160 described with reference to FIG. 1.

Figure 3:
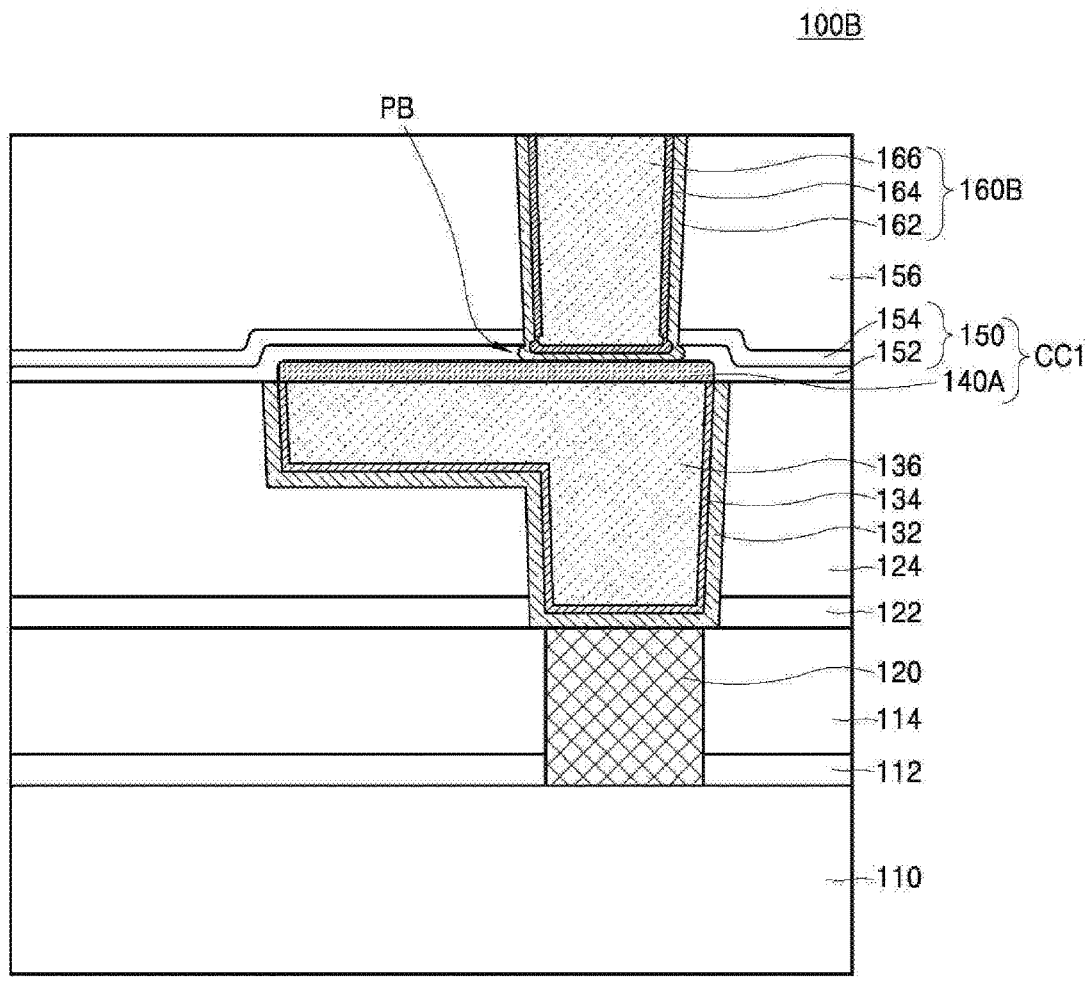

FIG. 3 is a cross-sectional view of components of an integrated circuit device 100B, according to an exemplary embodiment of the inventive concept.

Referring to FIG. 3, the structure of the integrated circuit device 100B is substantially the same as the structure of the integrated circuit device 100 of FIG. 1. The integrated circuit device 100B includes an upper wiring layer 160B that contacts a top surface of the first conductive alloy capping layer 140A by penetrating the insulating capping layer 150 of the complex capping layer CC1. However, in the integrated circuit device 100B, a side wall of the first insulating capping layer 152, which faces the upper wiring layer 160B, is recessed relative to a side wall of the second insulating capping layer 154. Further, a portion of the side wall of the upper wiring layer 160B, which faces the recessed side wall of the first insulating capping layer 152, includes a protruding portion PB. The protruding portion PB extends into the recessed portion of the side wall of the first insulating capping layer 152, as shown in FIG. 3. In an exemplary embodiment, the conductive barrier film 162, the metal liner 164, and the metal film 166, which form the upper wiring layer 160B, include a side wall externally protruding from the protruding portion PB facing the first insulating capping layer 152. Details regarding the upper wiring layer 160B are the same as or similar to those of the upper wiring layer 160 described with reference to FIG. 1.

Figure 4:
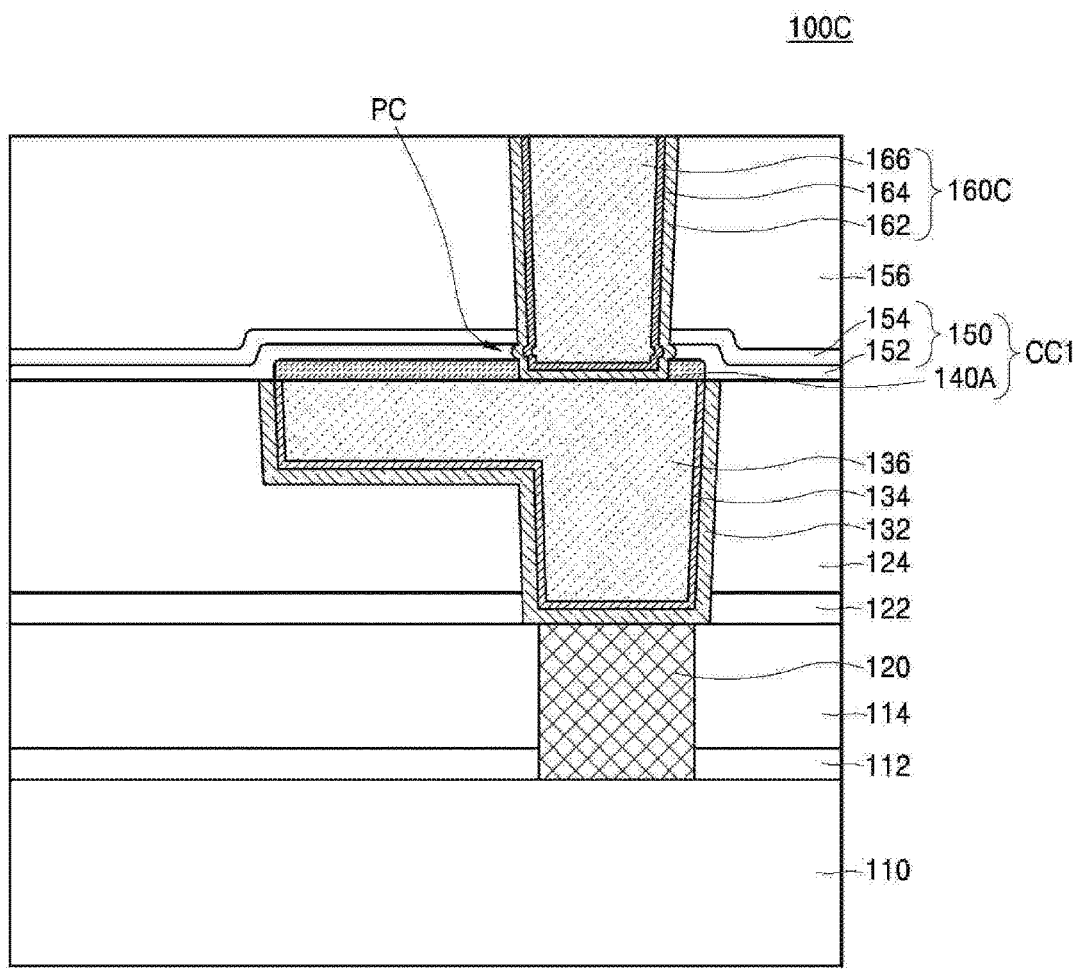

FIG. 4 is a cross-sectional view of components of an integrated circuit device 100C, according to an exemplary embodiment of the inventive concept.

Referring to FIG. 4, the structure of the integrated circuit device 100C is substantially the same as the structure of the integrated circuit device 100A of FIG. 2. The integrated circuit device 100C includes an upper wiring layer 160C which is the same as or similar to the upper wiring layer 160A of the integrated circuit device 100A of FIG. 2. Due to its penetration of the insulating capping layer 150 and the first conductive alloy capping layer 140a, which form the complex capping layer CC1, the upper wiring layer 160C contacts the metal film 136. However, in the integrated circuit device 100C, a side wall of the first insulating capping layer 152 that faces the upper wiring layer 160C is recessed relative to a side wall of the second insulating capping layer 154. Further, a protruding portion PC is formed at a portion of the side wall of the upper wiring layer 160C that faces the recessed side wall of the first insulating capping layer 152. The protruding portion PC extends into the recessed side wall, as shown in FIG. 4. The conductive barrier film 162, the metal liner 164, and the metal film 166, which form the upper wiring layer 160C, may each include a side wall externally protruding from the protruding portion PC facing the first insulating capping layer 152. Details regarding the upper wiring layer 160C are the same as or similar to those of the upper wiring layer 160 described with reference to FIG. 1.

Figure 5:
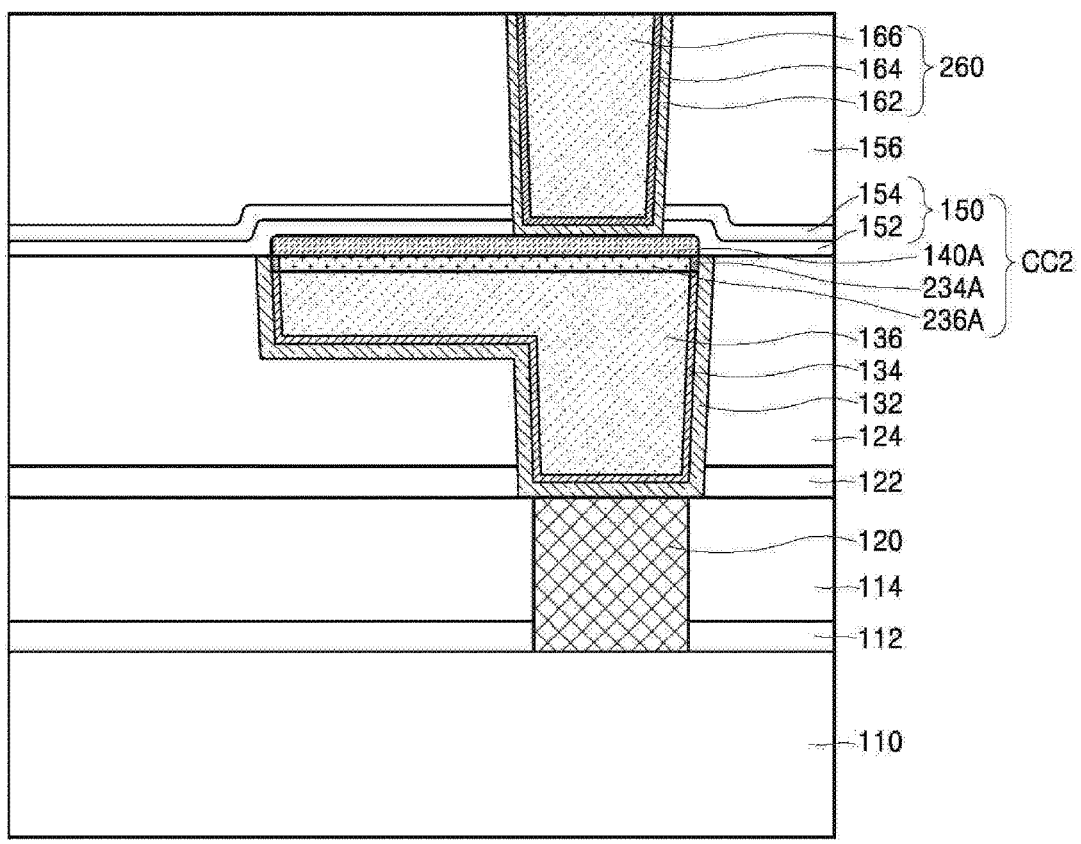

FIG. 5 is a cross-sectional view of components of an integrated circuit device 200, according to an exemplary embodiment of the inventive concept.

Referring to FIG. 5, the structure of the integrated circuit device 200 is substantially the same as the structure of the integrated circuit device 100 of FIG. 1. However, in the integrated circuit device 200, a complex capping layer CC2 further includes a second conductive alloy capping layer 236A and a third conductive alloy capping layer 234A. The second conductive alloy capping layer 236A is disposed between the metal film 136 and the first conductive alloy capping layer 140A. The third conductive alloy capping layer 234A covers the metal liner 134, and is disposed between the second conductive alloy capping layer 236A and the conductive barrier film 132. Further, the third conductive alloy capping layer 234A is disposed between the metal liner 134 and the first conductive alloy capping layer 140A. The second conductive alloy capping layer 236A may include a first metal included in the metal film 136, and a second semiconductor element. According to an exemplary embodiment, the second semiconductor element may be at least one of Si or Ge. In an exemplary embodiment, the second semiconductor element is the same element as a first semiconductor element included in the first conductive alloy capping layer 140A. However, the second semiconductor element is not limited thereto. In an exemplary embodiment, the third conductive alloy capping layer 234A includes a metal included in the metal liner 134, and the second semiconductor element. According to an exemplary embodiment, the third conductive alloy capping layer 234A is formed of an alloy including Co and Si such as, for example, CoSi, CoSi$_2$, Co$_2$Si, or Co$_3$Si. According to an exemplary embodiment, the third conductive alloy capping layer 234A is formed of an alloy including Co and Ge such as, for example, CoGe, CoGe$_2$, CoGe$_3$, CoGe$_7$, or Co$_4$Ge.

In an exemplary embodiment, the integrated circuit device 200 includes an upper wiring layer 260 electrically connected to the metal film 136 by penetrating the second insulating film 156 that covers the complex capping layer CC2, and by penetrating at least a portion of the complex capping layer CC2. In an exemplary embodiment, the upper wiring layer 260 includes the metal film 166, as well as the conductive barrier film 162 and the metal liner 164 surrounding the metal film 166. As shown in FIG. 5, in an exemplary embodiment, the upper wiring layer 260 contacts a top surface of the first conductive alloy capping layer 140A by penetrating the insulating capping layer 150 of the complex capping layer CC2. However, the location and the form of the upper wiring layer 260 may vary, and is not limited thereto.

In the integrated circuit device 200 of FIG. 5, the metal film 136 is covered by the complex capping layer CC2. The complex capping layer CC2 includes the second conductive alloy capping layer 236A, the first conductive alloy capping layer 140A, and the insulating capping layer 150, which are sequentially formed on the metal film 136, as well as the third conductive alloy capping layer 234A covering a side wall of the second conductive alloy capping layer 236A. A resistance increase and a current leakage of the metal film 136 may be suppressed by the complex capping layer CC2, and electromigration of a metal from the metal film 136 may be suppressed. Thus, according to exemplary embodiments of the present invention, reliability of a wiring structure including the metal film 136 may be improved.

Figure 6:
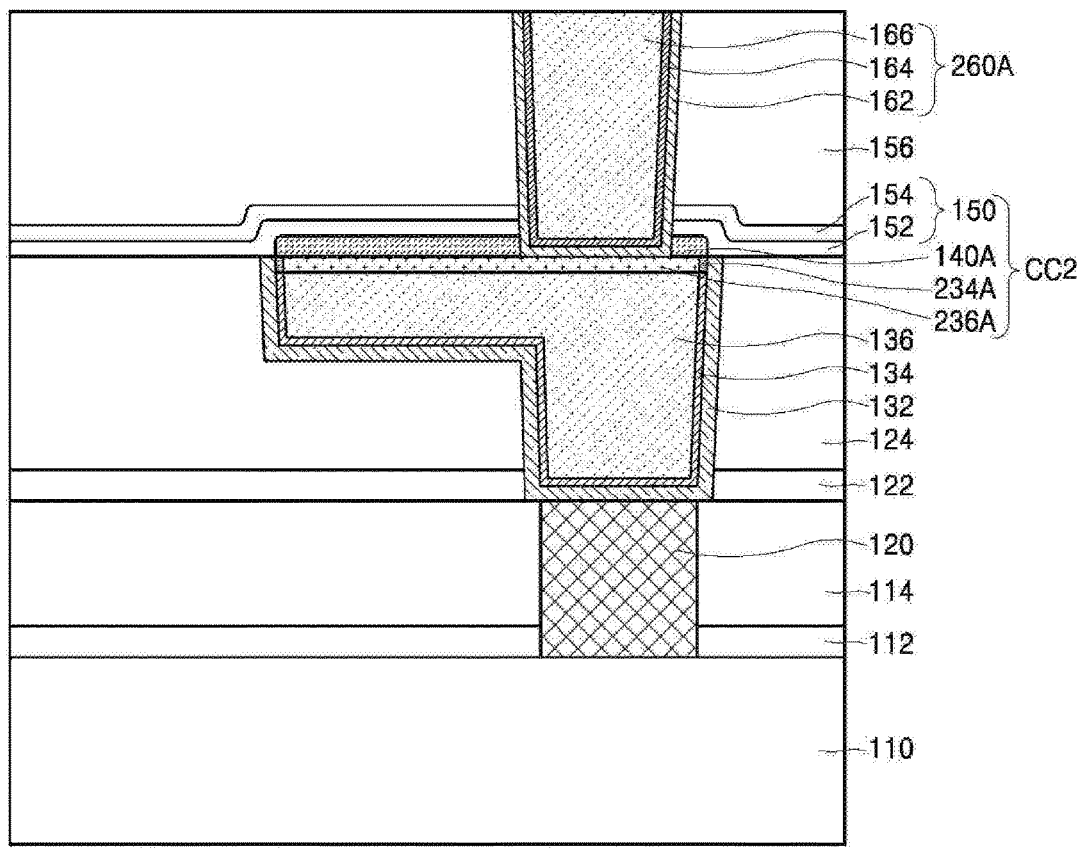

FIG. 6 is a cross-sectional view of components of an integrated circuit device 200A, according to an exemplary embodiment of the inventive concept.

Referring to FIG. 6, a structure of the integrated circuit device 200A is substantially the same as the structure of the integrated circuit device 200 of FIG. 5. However, the integrated circuit device 200A includes an upper wiring layer 260A that contacts a top surface of the second conductive alloy capping layer 236A by penetrating the insulating capping layer 150 and the first conductive alloy capping layer 140A of the complex capping layer CC2. Details regarding the upper wiring layer 260A are the same as or similar to those of the upper wiring layer 160 described with reference to FIG. 1.

Figure 7:
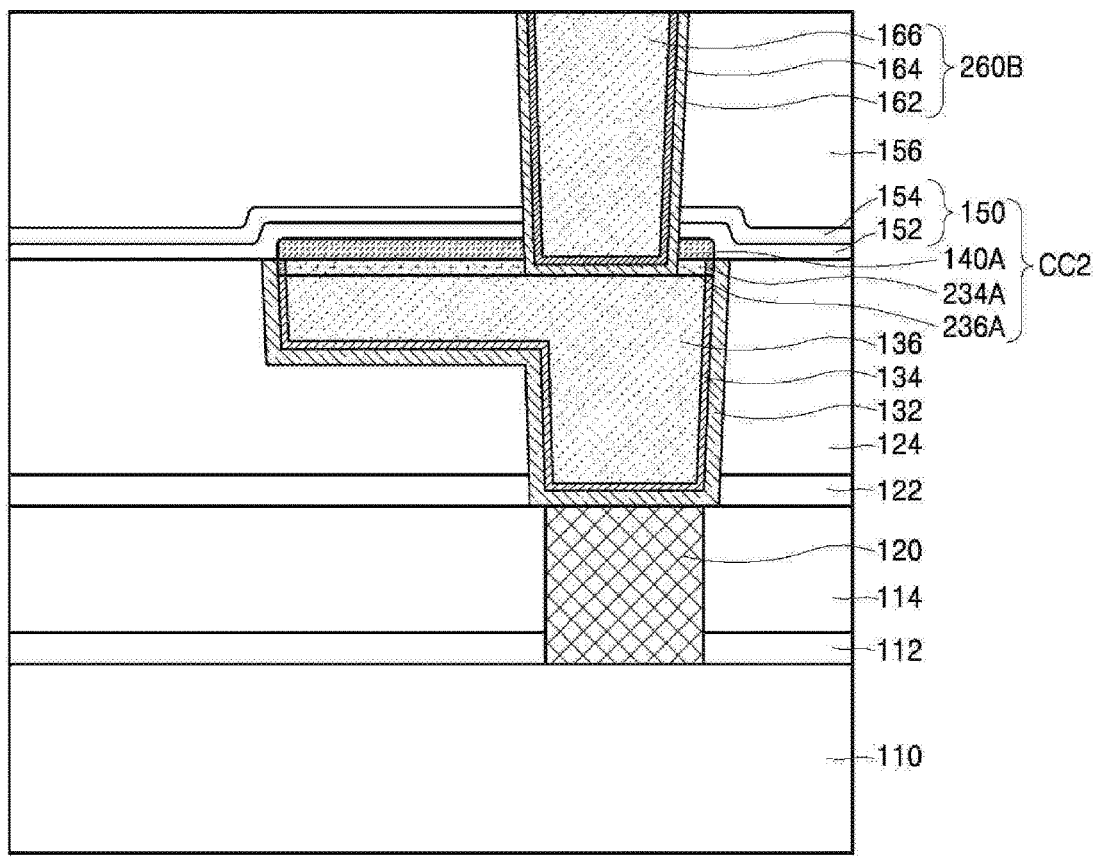

FIG. 7 is a cross-sectional view of components of an integrated circuit device 200B, according to an exemplary embodiment of the inventive concept.

Referring to FIG. 7, a structure of the integrated circuit device 200B is substantially the same as the structure of the integrated circuit device 200 of FIG. 5. However, the integrated circuit device 200B includes an upper wiring layer 260B that contacts the metal film 136 by penetrating the insulating capping layer 150, the first conductive alloy capping layer 140A, and the second conductive alloy capping layer 236A, which form the complex capping layer CC2. Details regarding the upper wiring layer 260B are the same as or similar to those of the upper wiring layer 160 described with reference to FIG. 1.

Figure 8:
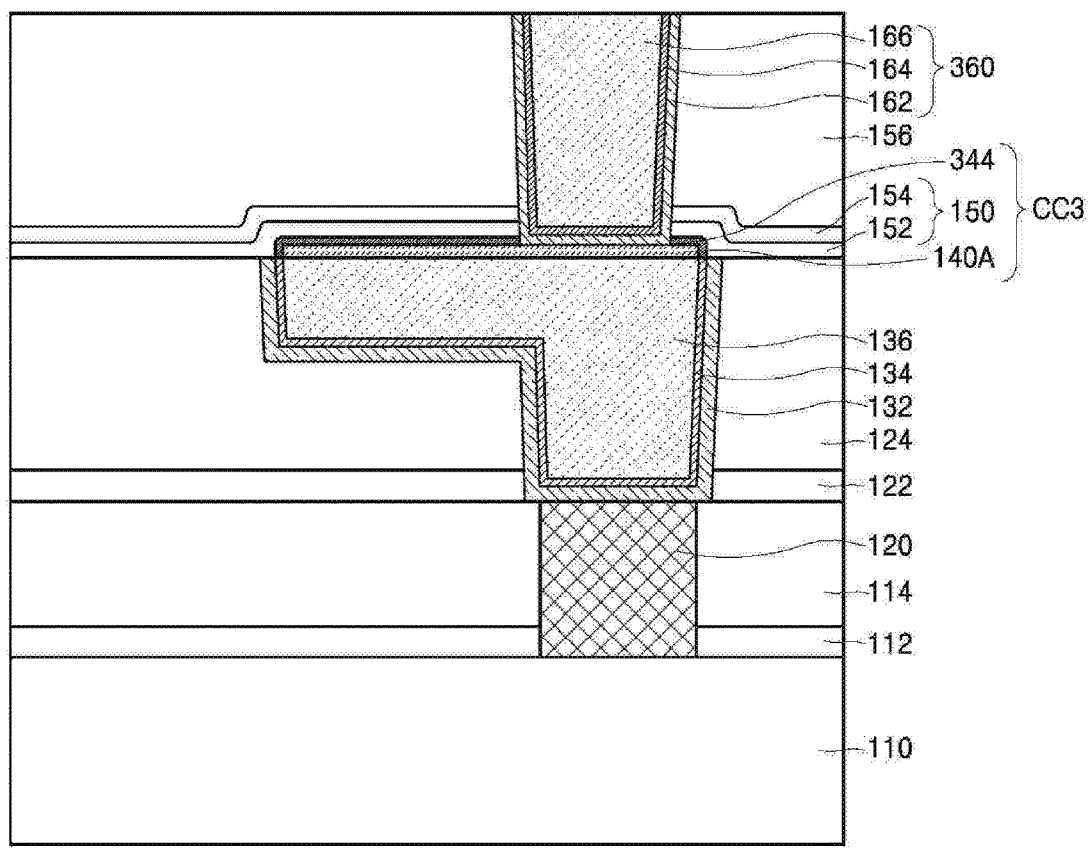

FIG. 8 is a cross-sectional view of components of an integrated circuit device 300, according to an exemplary embodiment of the inventive concept.

Referring to FIG. 8, a structure of the integrated circuit device 300 is substantially the same as the structure as the integrated circuit device 100 of FIG. 1. However, in the integrated circuit device 300, a complex capping layer CC3 further includes a nitrated alloy layer 344. The nitrated alloy layer 344 is disposed between the first conductive alloy capping layer 140A and the insulating capping layer 150. In an exemplary embodiment, the nitrated alloy layer 344 includes a first metal, a first semiconductor element, and nitrogen atoms. The first metal and the first semiconductor element are also included in the first conductive alloy capping layer 140A. According to an exemplary embodiment, the nitrated alloy layer 344 includes CoSiN or CoGeN.

In an exemplary embodiment, the integrated circuit device 300 includes an upper wiring layer 360 electrically connected to the metal film 136 by penetrating the second insulating film 156 that covers the complex capping layer CC3, and by penetrating at least a portion of the complex capping layer CC3. In an exemplary embodiment, the upper wiring layer 360 includes the metal film 166, as well as the conductive barrier film 162 and the metal liner 164 surrounding a bottom surface and a side wall of the metal film 166. As shown in FIG. 8, in an exemplary embodiment, the upper wiring layer 360 contacts a top surface of the first conductive alloy capping layer 140A by penetrating the insulating capping layer 150 and the nitrated alloy layer 344 of the complex capping layer CC3. However, the upper wiring layer 360 may vary, and is not limited thereto.

In the integrated circuit device 300 of FIG. 8, the metal film 136 is covered by the complex capping layer CC3, which includes the first conductive alloy capping layer 140A, the nitrated alloy layer 344, and the insulating capping layer 150, which are sequentially formed on the metal film 136. A resistance increase and a current leakage of the metal film 136 may be suppressed by the complex capping layer CC3, and electromigration of a metal from the metal film 136 may be suppressed. Thus, according to exemplary embodiments of the inventive concept, reliability of a wiring structure including the metal film 136 may be improved.

Figure 9:
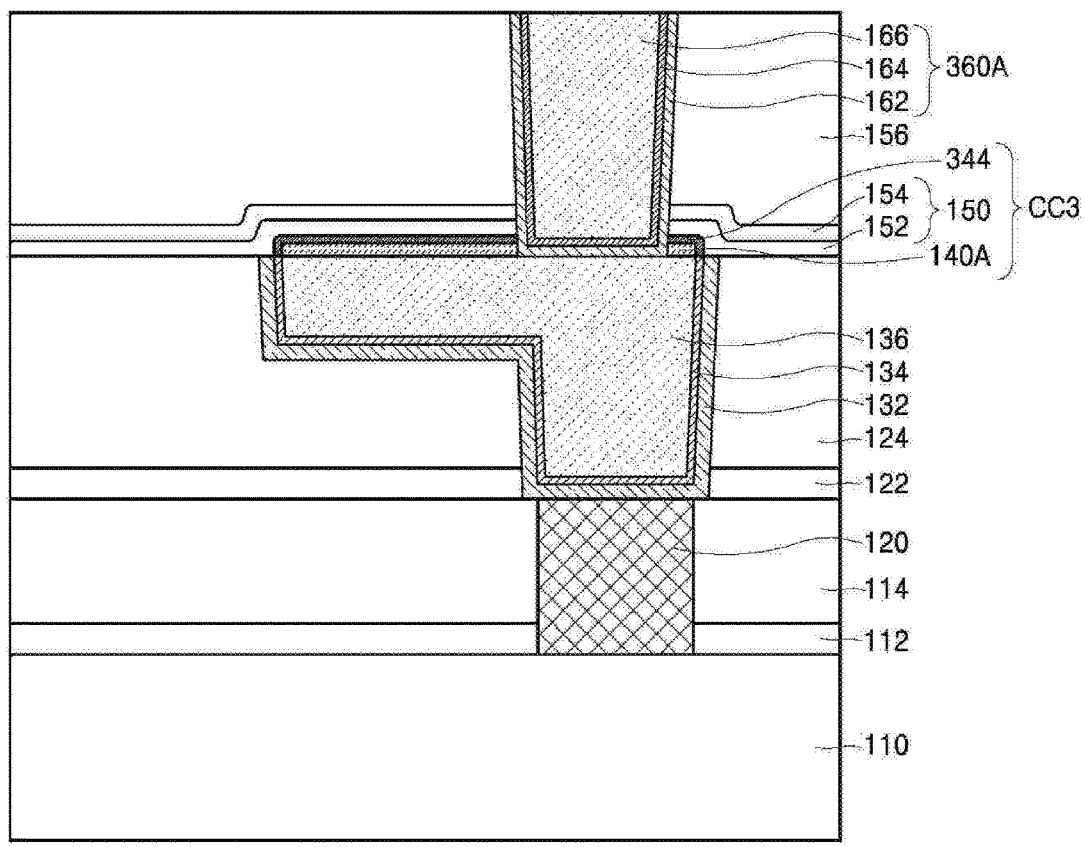

FIG. 9 is a cross-sectional view of components of an integrated circuit device 300A, according to an exemplary embodiment of the inventive concept.

Referring to FIG. 9, a structure of the integrated circuit device 300A is substantially the same as the structure of the integrated circuit device 300 of FIG. 8. However, the integrated circuit device 300A includes an upper wiring layer 360A that contacts the metal film 136 by penetrating the complex capping layer CC3, which is formed of the insulating capping layer 150, the nitrated alloy layer 344, and the first conductive alloy capping layer 140A. Details regarding the upper wiring layer 360A are the same as or similar to those of the upper wiring layer 160 described with reference to FIG. 1.

Figure 10:
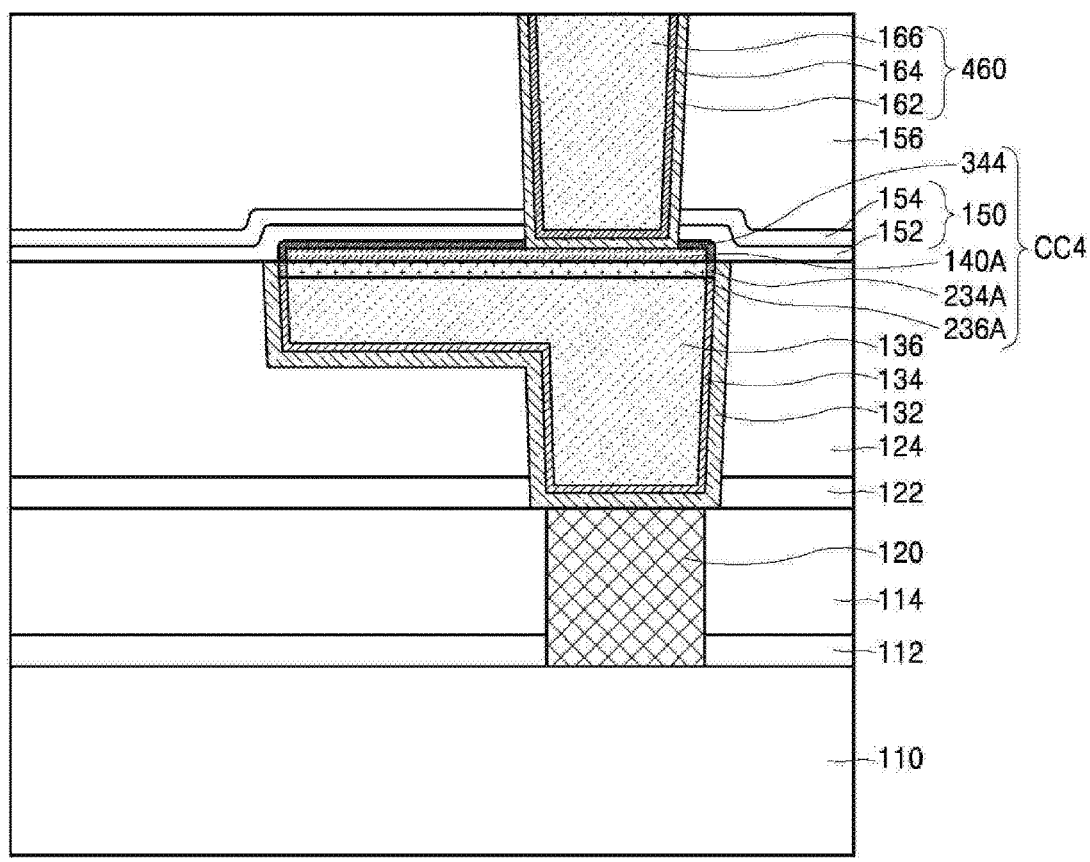

FIG. 10 is a cross-sectional view of components of an integrated circuit device 400, according to an exemplary embodiment of the inventive concept.

Referring to FIG. 10, a structure of the integrated circuit device 400 has substantially the same structure as the integrated circuit device 100 of FIG. 1. However, in the integrated circuit device 400, a complex capping layer CC4 further includes the second conductive alloy capping layer 236A, the third conductive alloy capping layer 234A, and the nitrated alloy layer 344. In an exemplary embodiment, similar to the integrated circuit device 200 of FIG. 5, the second conductive alloy capping layer 236A is disposed between the metal film 136 and the first conductive alloy capping layer 140A. In an exemplary embodiment, the third conductive alloy capping layer 234A is disposed between the metal liner 134 and the nitrated alloy layer 344, and covers a side wall of the second conductive alloy capping layer 236A. In an exemplary embodiment, similar to the integrated circuit device 300 of FIG. 8, the nitrated alloy layer 344 is disposed between the first conductive alloy capping layer 140A and the insulating capping layer 150.

In an exemplary embodiment, the integrated circuit device 400 includes an upper wiring layer 460 that is electrically connected to the metal film 136 by penetrating the second insulating film 145 that covers the complex capping layer CC4, and by penetrating at least a portion of the complex capping layer CC4. In an exemplary embodiment, the upper wiring layer 460 includes the metal film 166, and the conductive barrier film 162 and the metal liner 164 surround a bottom surface and a side wall of the metal film 166. As shown in FIG. 10, in an exemplary embodiment, the upper wiring layer 460 contacts a top surface of the first conductive alloy capping layer 140A by penetrating the insulating capping layer 150 and the nitrated alloy layer 344 of the complex capping layer CC4. However, the upper wiring layer 460 may vary, and the inventive concept is not limited thereto.

In the integrated circuit device 400 of FIG. 10, the metal film 136 is covered by the complex capping layer CC4, which includes the second conductive alloy capping layer 236A, the first conductive alloy capping layer 140A, the nitrated alloy layer 344, and the insulating capping layer 150, which are sequentially formed on the metal film 136, as well as the third conductive alloy capping layer 234A, which covers a side wall of the second conductive alloy capping layer 236A. A resistance increase and a current leakage of the metal film 136 may be suppressed by the complex capping layer CC4, and electromigration of a metal from the metal film 136 may be suppressed. Thus, according to exemplary embodiments of the inventive concept, reliability of a wiring structure including the metal film 136 may be improved.

FIGS. 11A through 11J are cross-sectional views illustrating a method of manufacturing an integrated circuit device, according to an exemplary embodiment of the inventive concept. A method of manufacturing the integrated circuit device 100 of FIG. 1 will be described with reference to FIGS. 11A through 11J. A further description of elements previously described may be omitted herein.

Figure 11A:
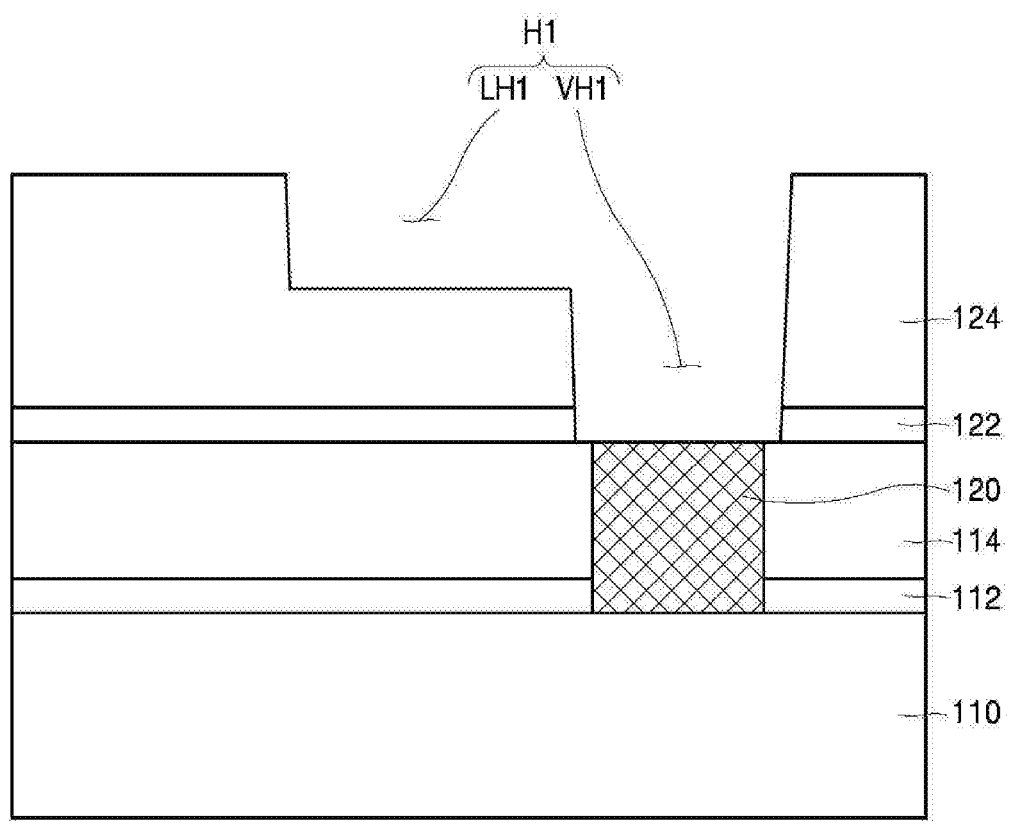
FIGS. 11A through 11J are cross-sectional views illustrating a method of manufacturing an integrated circuit device, according to an exemplary embodiment of the inventive concept.

Referring to FIG. 11A, the first etch-stop layer 112 and the lower insulating film 114 are formed over the substrate 110. In addition, the lower conductive film 120, which is electrically connected to a conductive region of the substrate 110 by penetrating the lower insulating film 114 and the first etch-stop layer 112, is formed.

In an exemplary embodiment, to form the lower conductive film 120, an opening is formed by partially etching the lower insulating film 114 and the first etch-stop layer 112, and the opening is then filled with a conductive material(s). According to an exemplary embodiment, the lower conductive film 120 is a wiring layer that includes a metal film and a conductive barrier film surrounding the metal film. The metal film may be formed of, for example, Cu, W, Al, or Co. The conductive barrier film may be formed of, for example, Ta, TaN, Ti, TiN, or a combination thereof. In an exemplary embodiment, the lower conductive film 120 is electrically connected to the conductive region of the substrate 110. According to an exemplary embodiment, the lower conductive film 120 is a source/drain region of a transistor or a gate electrode.

In an exemplary embodiment, the second etch-stop film 122 and the first insulating film 124 are formed over the lower insulating film 114, and a first hole H1 that exposes the lower conductive film 120 by penetrating the first insulating film 124 and the second etch-stop film 122 is formed. In an exemplary embodiment, the first hole H1 includes a first via hole VH1 and a first line hole LH1, which are adjacent to each other. In an exemplary embodiment, to form the first hole H1, the first insulating film 124 and the second etch-stop film 122 are dry-etched by using a plurality of etch mask patterns having different etch selectivities.

Figure 11B:
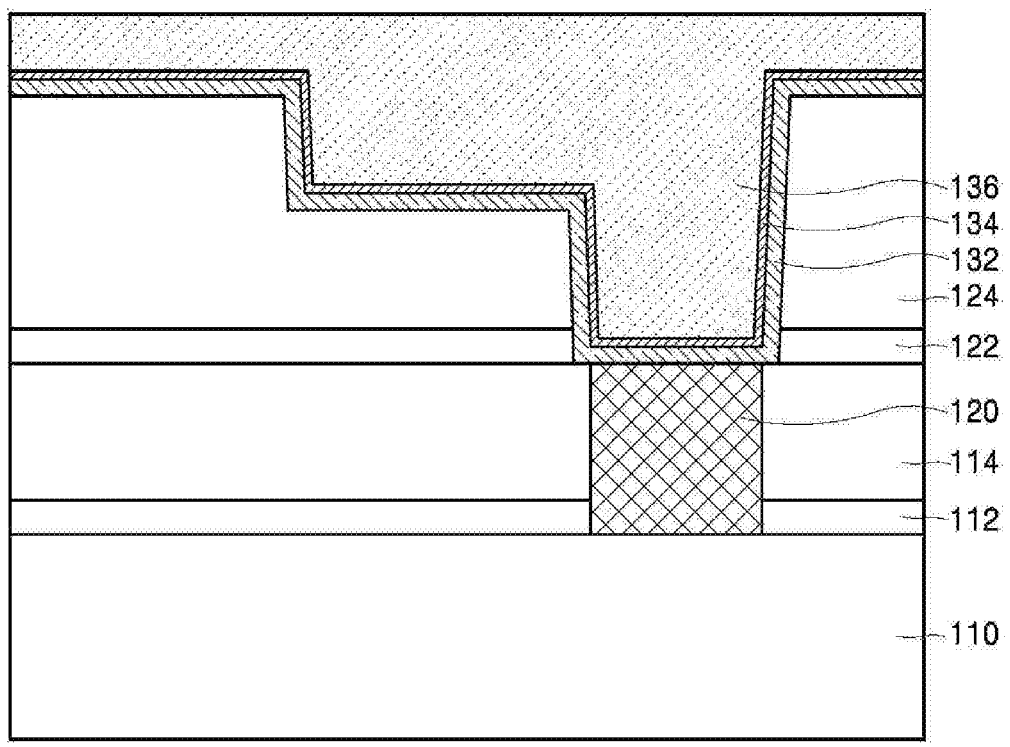

Referring to FIG. 11B, the conductive barrier film 132 is formed in the first hole H1 (see FIG. 11A), and the metal film 136 is formed over the conductive barrier film 132. According to an exemplary embodiment, to form the metal film 136, the metal liner 134 is formed on the conductive barrier film 132, a metal seed layer is formed on the metal liner 134, and a plating process is then performed. In an exemplary embodiment, to form the conductive barrier film 132, the metal liner 134, and the metal seed layer, a process including physical vapor deposition (PVD), chemical vapor deposition (CVD), atomic layer deposition (ALD), or a combination thereof may be used. According to an exemplary embodiment, to form the metal film 136, PVD, CVD, or ALD may be performed instead of the plating process.

Figure 11C:
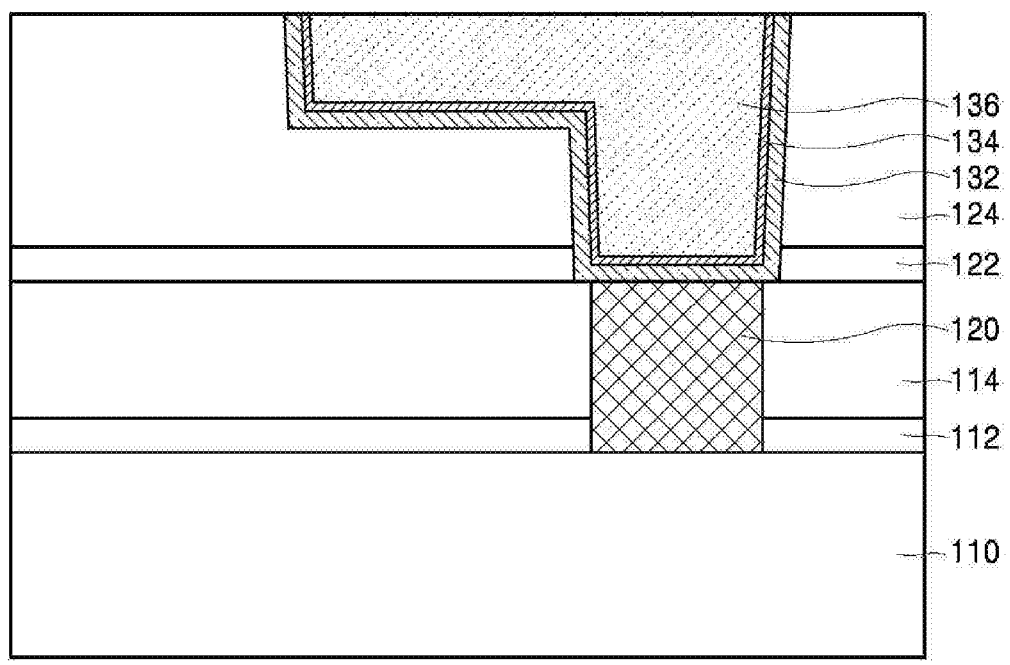

Referring to FIG. 11C, the metal film 136, the metal liner 134, and the conductive barrier film 132 are etched and planarized until a top surface of the first insulating film 124 is exposed by using, for example, a chemical mechanical polishing (CMP) process and/or an etch-back process. As a result, the conductive barrier film 132, the metal liner 134, and the metal film 136 remain only in the first hole H1 (see FIG. 11A).

Figure 11D:
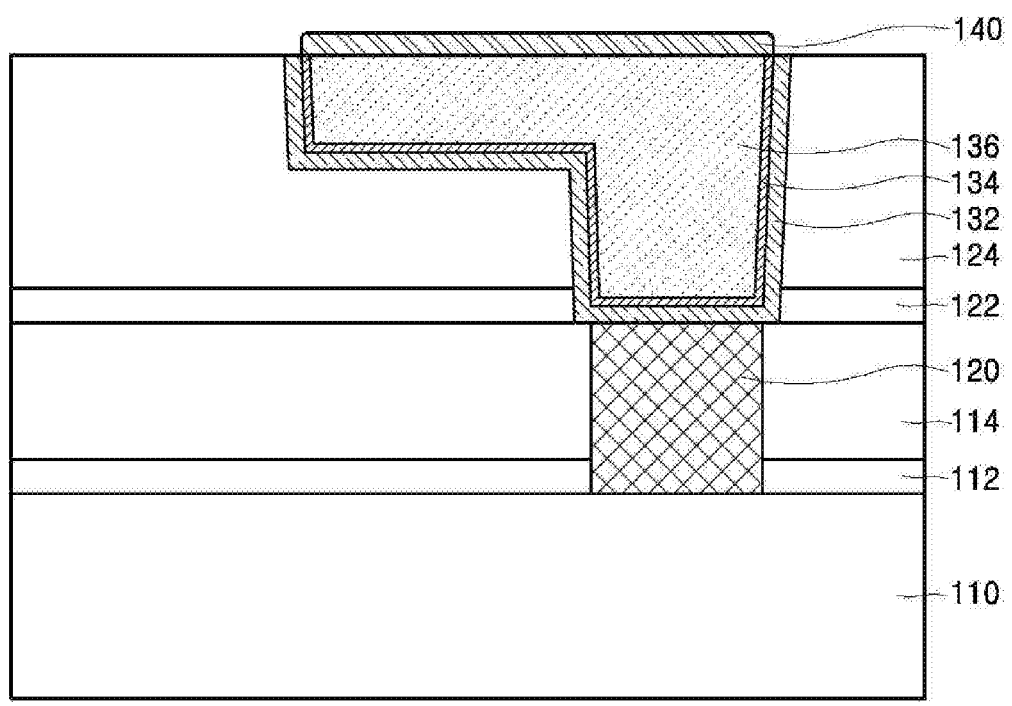

Referring to FIG. 11D, a first conductive capping layer 140 is selectively formed on the metal film 136. In an exemplary embodiment, the first conductive capping layer 140 is not formed on exposed surfaces of the first insulating film 124 and the conductive barrier film 132, but rather, is selectively formed only on an exposed surface of each of the metal film 136 and the metal liner 134. A selective CVD process may be used to form the first conductive capping layer 140. According to an exemplary embodiment, during a deposition process for forming the first conductive capping layer 140, a metal forming the first conductive capping layer 140 may be deposited only on the exposed surfaces of the metal film 136 and metal liner 134 via a self-assembly method, according to affinity with metals forming the metal film 136 and metal liner 134. Thus, in an exemplary embodiment, the first conductive capping layer 140 is selectively formed only on the exposed surface of each of the metal film 136 and the metal liner 134. A top surface of the first conductive capping layer 140 may have a flat, curved, or dome form. The first conductive capping layer 140 may include a metal or alloy including, for example, Co, Ni, Ta, Ru, W, Mn, or a combination thereof.

Figure 11E:
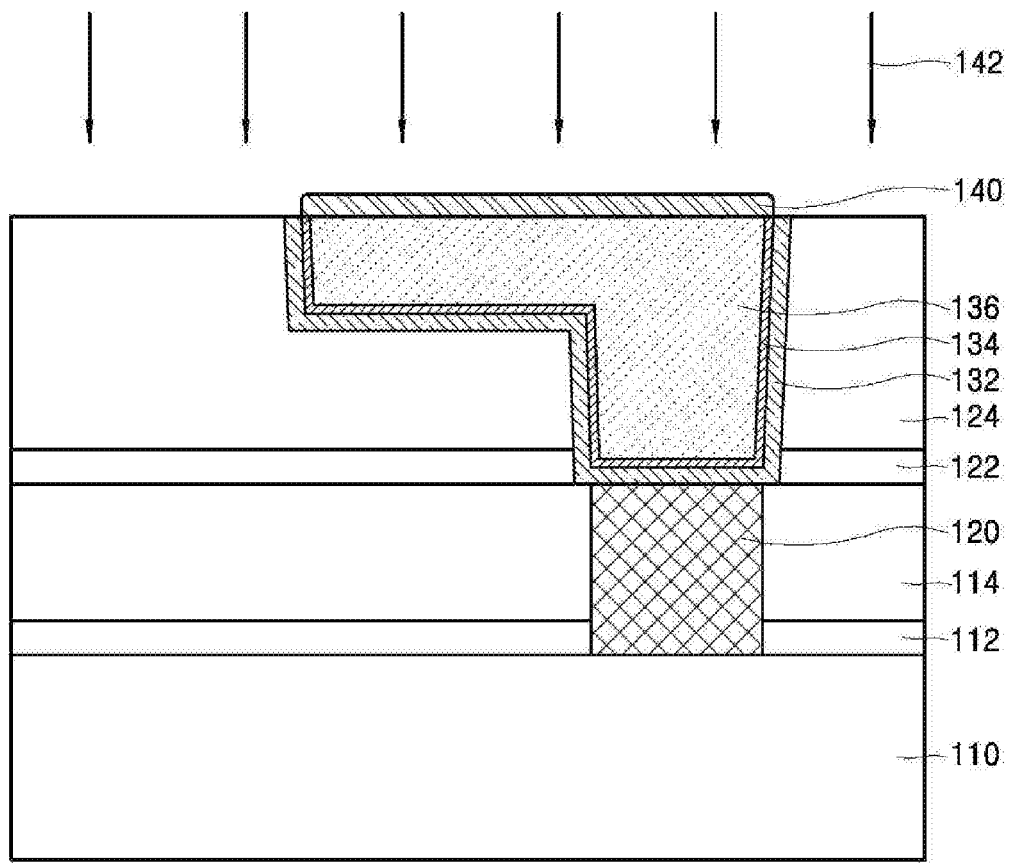

Referring to FIG. 11E, the resulting structure obtained by forming the first conductive capping layer 140 is annealed under a first gas environment 142. The first gas environment 142 may be, for example, a reducing gas environment. According to an exemplary embodiment, the first gas environment 142 may be, for example, a $H_2$ gas environment. According to an exemplary embodiment, the first gas environment 142 may be, for example, a mixture gas environment in which $H_2$ gas and an inert gas such as argon (Ar), helium (He), neon (Ne), or nitrogen ($N_2$) gas are mixed. While performing the annealing process under the first gas environment 142, a plasma atmosphere may be created by applying radio frequency (RF) power.

By performing the annealing process under the first gas environment 142, an unwanted natural oxide film that remains on the exposed surface of the first conductive capping layer 140 may be removed via reduction, and thus, surface damage may be resolved. The annealing process may be performed at a temperature from about 300° C. to about 400° C., under pressure from about 1 torr to about 20 torr, and for a duration of about 1 second to about 1 minute, under the first gas environment 142. For example, under the first gas environment 142, the annealing process may be performed at a temperature of about 360° C., under pressure of about 2.4 torr, and for about 30 seconds. However, such conditions are merely exemplary, and the inventive concept is not limited thereto.

Figure 11F:
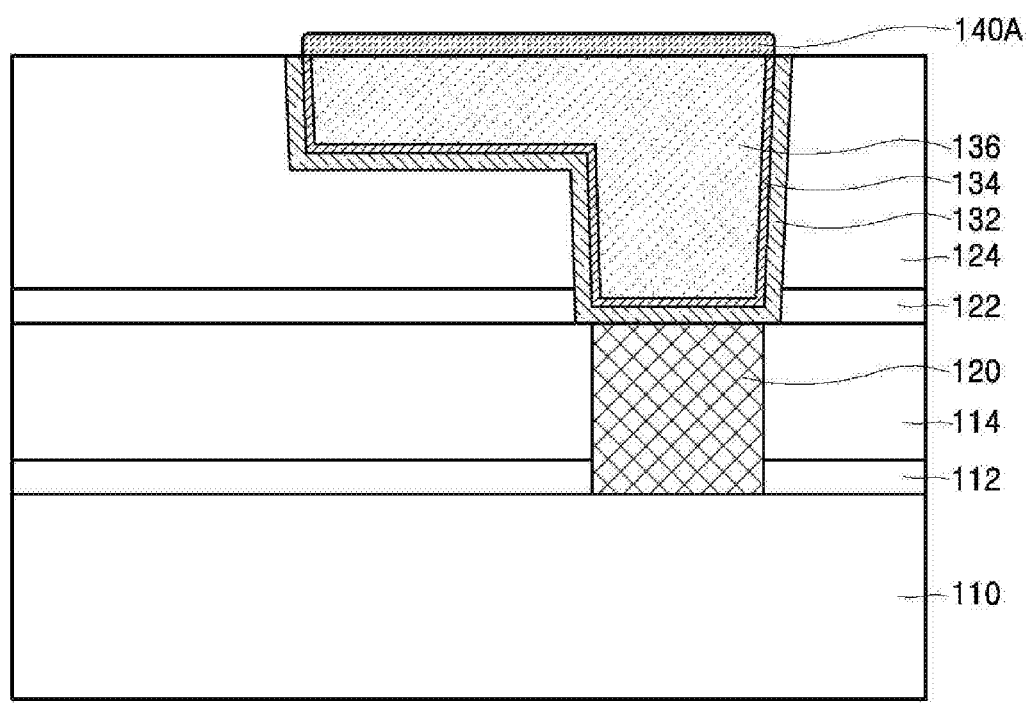

Referring to FIG. 11F, the first conductive capping layer 140 (see FIG. 11E) annealed under the first gas environment 142 is annealed under a gas environment including a first semiconductor element, thereby forming, from the first conductive capping layer 140, the first conductive alloy capping layer 140A that includes the first semiconductor element. A process of annealing the first conductive capping layer 140 under the gas environment including the first semiconductor element may be performed in-situ without breaking vacuum after the process of annealing the first conductive capping layer 140 under the first gas environment 142 described with reference to FIG. 11E.

The first semiconductor element may be at least one of Si or Ge. A gas including the first semiconductor element may include a silicon source, such as, for example, $SiH_4$, $Si_2H_6$, $Si(CH_3)_4$, or $SiH_2Cl_2$, or a germanium source, such as, for example, $GeH_4$ or $GeCl_4$.

According to an exemplary embodiment, the gas environment including the first semiconductor element may be a mixture gas environment in which the gas including the first semiconductor element and an inert gas, such as, for example, Ar, He, Ne, or $N_2$ gas, are mixed.

The annealing process may be performed via a plasma method under the gas environment including the first semiconductor element. The annealing process may be performed at a temperature from about 300° C. to about 400° C., under pressure from about 1 torr to about 20 torr, and for a duration of about 1 second to about 1 minute, under the gas environment including the first semiconductor element. For example, under the gas environment including the first semiconductor element, the annealing process may be performed at a temperature of about 360° C., under pressure of about 2.4 torr, and for about 2 to about 10 seconds. However, such conditions are merely exemplary, and the inventive concept is not limited thereto. According to an exemplary embodiment, the first conductive alloy capping layer 140A may not yet form a stable phase. However, the first conductive alloy capping layer 140a may form a stable phase due to a thermal budget received through the following described processes.

Figure 11G:
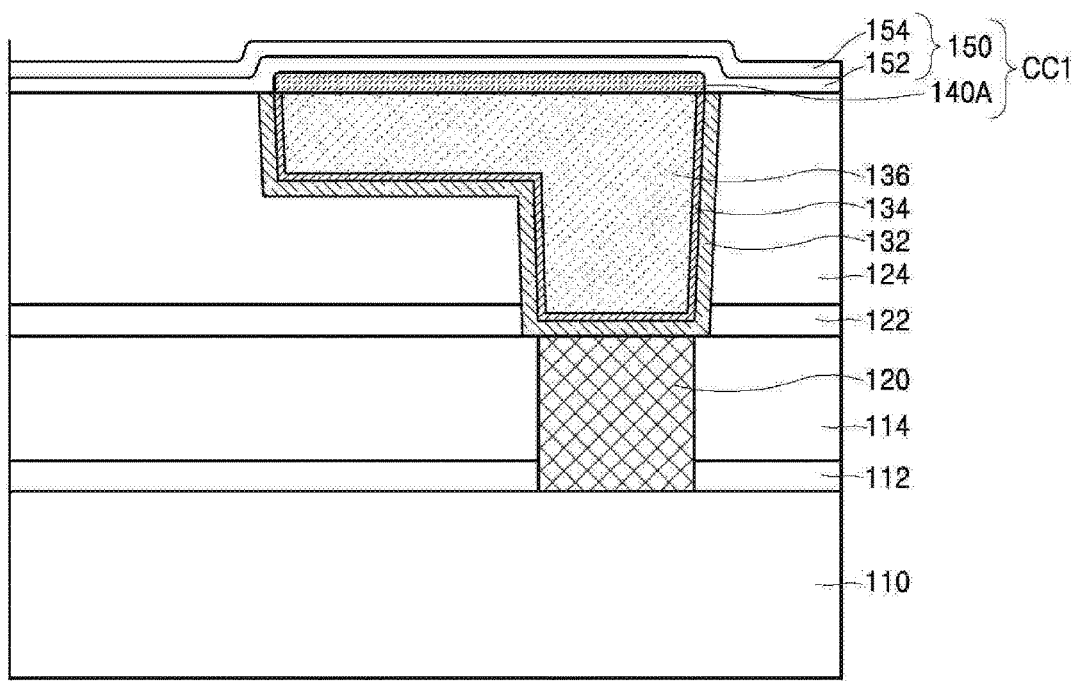

Referring to FIG. 11G, the insulating capping layer 150, which covers a top surface of each of the first conductive alloy capping layer 140A, the conductive barrier film 132, and the first insulating film 124, is formed.

In an exemplary embodiment, the insulating capping layer 150 has a multilayered structure including the first insulating capping layer 152, which includes a metal, and the second insulating capping layer 154, which does not include a metal. A CVD or ALD process may be used to form the first insulating capping layer 152. For example, a metal halogenide, such as $AlCl_3$, or a metal precursor, such as an organic metal compound, may be supplied on the substrate 110 together with a nitrogen-containing reaction gas, such as $N_2$, $NH_3$, $NO_2$, or $N_2O$. As a result, the first insulating capping layer 152 may be obtained via a reaction occurring between the metal precursor and the nitrogen-containing reaction gas. According to an exemplary embodiment, a sputtering process such as, for example, an ion-beam sputtering process or a magnetron sputtering process, may be used to form the first insulating capping layer 152. For example, the first insulating capping layer 152 may be formed by using an Al target and the nitrogen-containing reaction gas. The first insulating capping layer 152 formed of a metal oxynitride may be obtained according to a type of the reaction gas used to form the first insulating capping layer 152.

According to an exemplary embodiment, a CVD or ALD process may be used to form the second insulating capping layer 154. For example, in order to form the second insulating capping layer 154, an ALD process using a silicon precursor, such as $SiH_4$, and a reaction gas including a carbon-containing material, such as $CH_4$ or $C_2H_6$, may be performed.

The first conductive alloy capping layer 140A and the insulating capping layer 150, which are sequentially formed on the metal film 136, may form the complex capping layer CC1. According to exemplary embodiments, the complex capping layer suppresses a resistance increase and a current leakage of the metal film 136 and suppresses electromigration of a metal from the metal film 136.

Figure 11H:
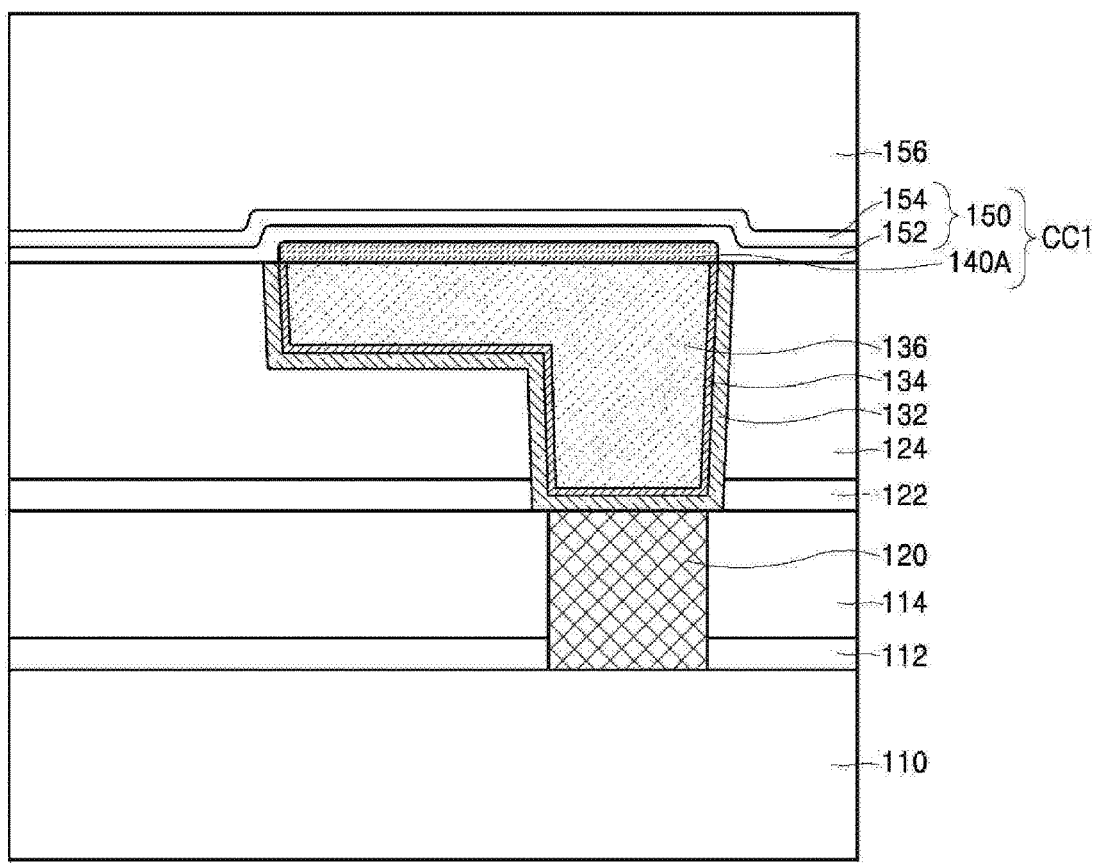

Referring to FIG. 11H, the second insulating film 156, which covers the complex capping layer CC1, is formed.

Figure 11I:
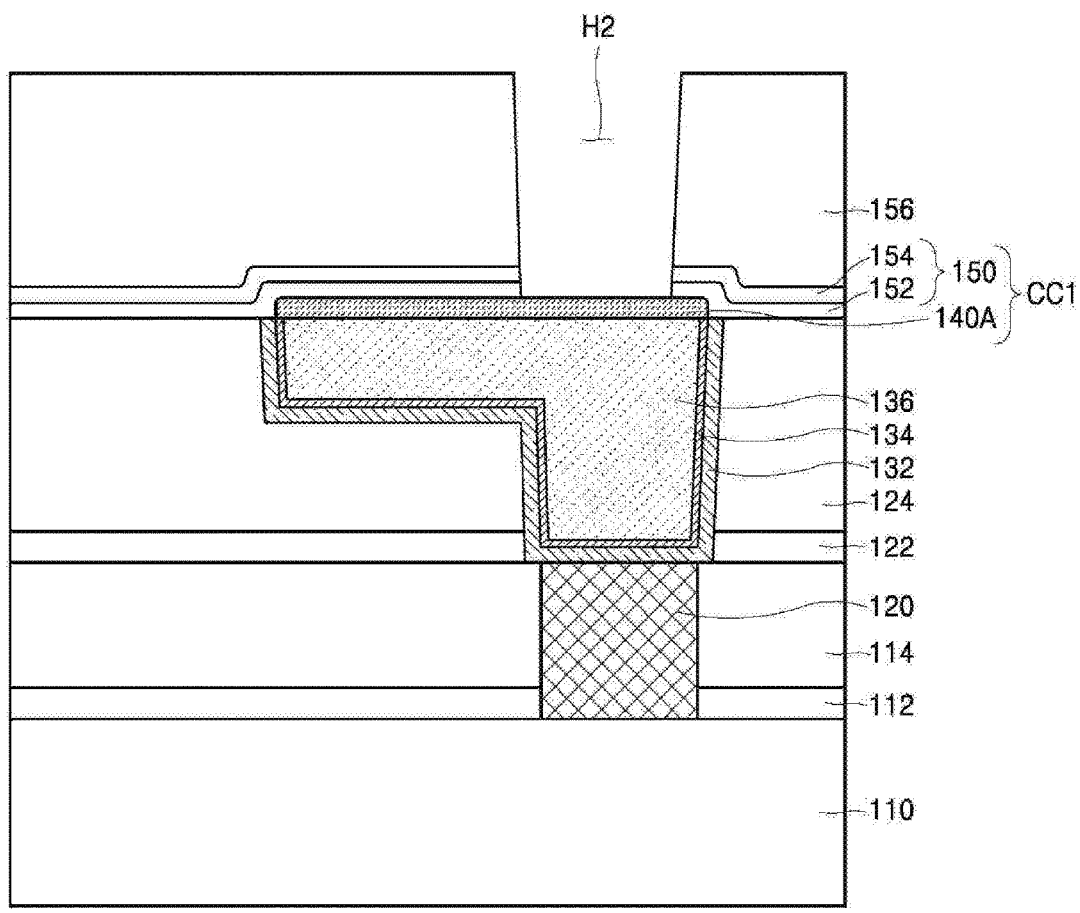

Referring to FIG. 11I, the second insulating film 156 is etched by using the insulating capping layer 150 as an etch-stop layer, and a second hole H2 is formed by etching the insulating capping layer 150 such that the first conductive alloy capping layer 140A is exposed.

In an exemplary embodiment, to form a second hole H2, the second insulating film 156 and the second insulating capping layer 154 are dry-etched using a plasma etching process or a reactive-ion etching (RIE) process. An etching speed may be reduced by the second insulating capping layer 154, and an etching endpoint may be provided by the first insulating capping layer 152, which includes a different type of material from the second insulating capping layer 154. Accordingly, the first conductive alloy capping layer 140A may be protected from a dry-etch atmosphere by the first insulating capping layer 152. The first insulating capping layer 152 may then be wet-etched to form the second hole H2, which exposes the first conductive alloy capping layer 140A. The first insulating capping layer 152 may be wet-etched using, for example, an acid solution, such as a sulfuric acid or hydrochloric acid solution. When the first insulating capping layer 152 is formed of AlON, the first insulating capping layer 152 may be dry-etched to form the second hole H2.

In an exemplary embodiment, when the first insulating capping layer 152 is etched to form the second hole H2, the first conductive alloy capping layer 140A is exposed through the second hole H2. The exposed first conductive alloy capping layer 140A has strong tolerance to an etch atmosphere of the first insulating capping layer 152, for example, to a wet-etchant. Thus, in exemplary embodiments, the first conductive alloy capping layer 140A is prevented from being undesirably etched and removed while forming the second hole H2. As a result, the metal film 136 is protected by the first conductive alloy capping layer 140A while the second hole H2 is formed, and thus, physical deterioration of the metal film 136 may be suppressed. Accordingly, reliability may be improved because a resistance increase and a current leakage of the metal film 136 and electromigration of a metal from the metal film 136 are suppressed.

Figure 11J:
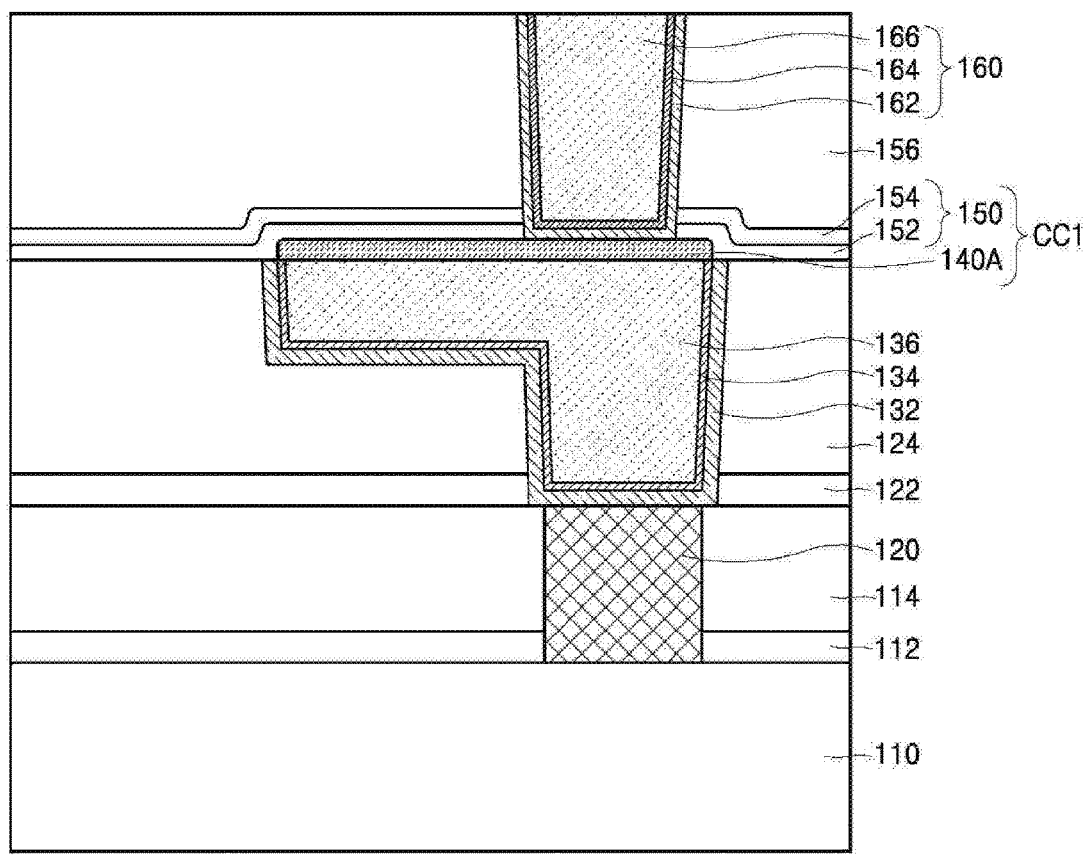

Referring to FIG. 11J, the conductive barrier film 162 is formed in the second hole H2 (see FIG. 11I), and the metal film 166 is formed over the conductive barrier film 162. According to an exemplary embodiment, to form the metal film 166, the metal liner 164 is formed on the conductive barrier film 162, a metal seed layer is formed on the metal liner 164, and a plating process is then performed.

The method described with reference to FIGS. 11A through 11J may be used to manufacture the integrated circuit devices 100A through 100C of FIGS. 2 through 4.

According to a method of manufacturing the integrated circuit device 100A of FIG. 2, the second hole H2 may be formed according to FIG. 11I, and the first conductive alloy capping layer 140A exposed at a bottom surface of the second hole H2 may then be further etched to expose the metal film 136. The process of FIG. 11J may then be performed to manufacture the integrated circuit device 100A of FIG. 2.

According to a method of manufacturing the integrated circuit device 100B of FIG. 3, the first insulating capping layer 152 may be removed via wet-etching while forming the second hole H2 according to FIG. 11I. By adjusting a wet-etched amount of the first insulating capping layer 152, a width of a portion of the second hole H2, which is defined by the first insulating capping layer 152, may be increased, such that a side wall of the first insulating capping layer 152, which is exposed by the second hole H2, is recessed relative to a side wall of the second insulating capping layer 154. The process of FIG. 11J may then be performed such that the protruding portion PB is formed at a portion of a side wall of the upper wiring layer 160B that faces the recessed side wall of the first insulating capping layer 152.

According to a method of manufacturing the integrated circuit device 100C of FIG. 4, after the second hole H2 is formed according to FIG. 11I, the metal film 136 may be exposed by further etching the first conductive alloy capping layer 140A that is exposed at the bottom surface of the second hole H2. The width of the second hole H2, which is defined by the first insulating capping layer 152, may then be increased using a wet-etching process, such that a side wall of the first insulating capping layer 152, which is exposed by the second hole H2, is recessed relative to a side wall of the second insulating capping layer 154 and a side wall of the first conductive alloy capping layer 140A. The process of FIG. 1J may then be performed such that the protruding portion PC is formed at a portion of a side wall of the upper wiring layer 160C that faces the recessed side wall of the first insulating capping layer 152.

Figure 12A:
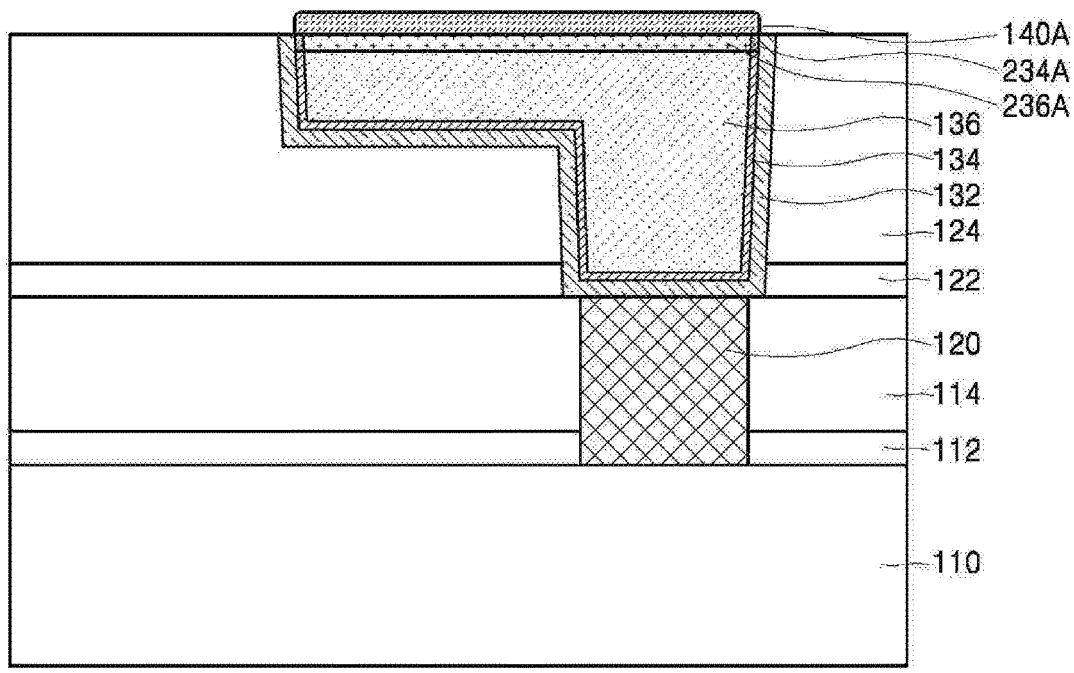
FIGS. 12A through 12C are cross-sectional views illustrating a method of manufacturing an integrated circuit device, according to an exemplary embodiment of the inventive concept.
Figure 12B:
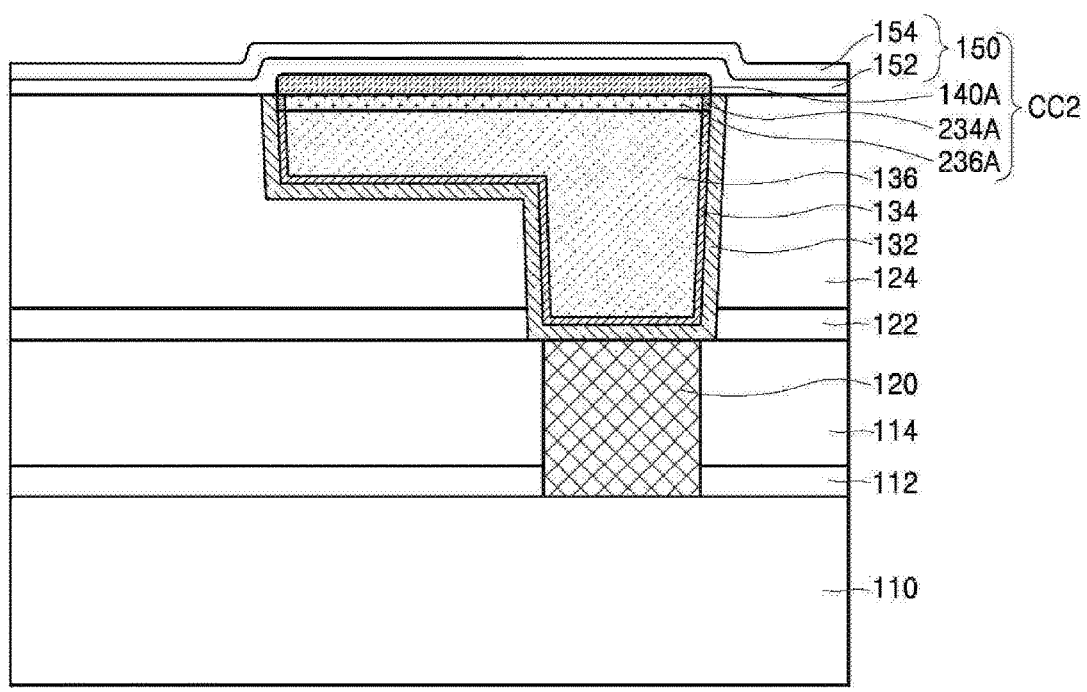
Figure 12C:
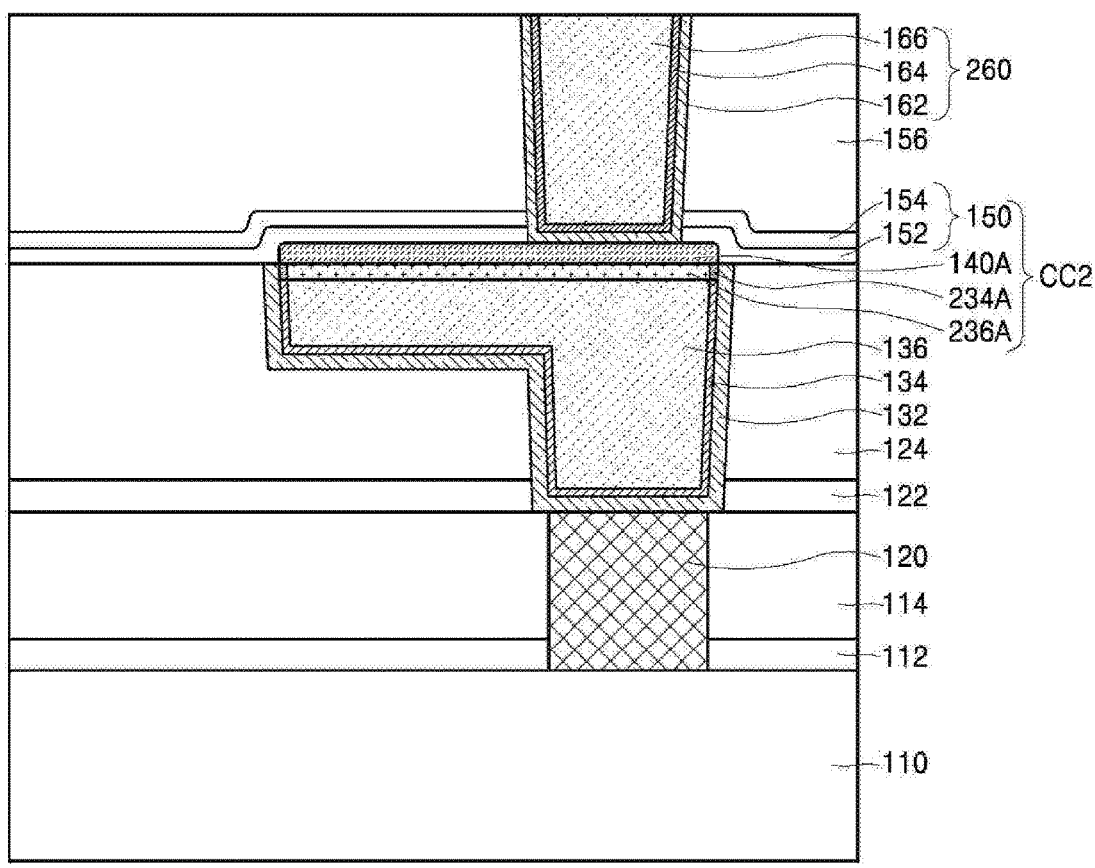

FIGS. 12A through 12C are cross-sectional views illustrating a method of manufacturing an integrated circuit device, according to an exemplary embodiment of the inventive concept. A method of manufacturing the integrated circuit device 200 of FIG. 5 will be described with reference to FIGS. 12A through 12C. A further description of elements previously described may be omitted herein.

Referring to FIG. 12A, a process of forming the first conductive capping layer 140 on the metal film 136 is performed on the substrate 110 by performing the processes described with reference to FIGS. 11A through 11D. The first conductive alloy capping layer 140A including a first semiconductor element is formed from the first conductive capping layer 140 by annealing the first conductive capping layer 140 under the first gas environment 142 in the same manner described above with reference to FIG. 11E, and by annealing the first conductive capping layer 140 under the gas environment including the first semiconductor element in the same manner described above with reference to FIG. 11F. However, in the exemplary embodiment of FIGS. 12A through 12C, the annealing process is performed under the gas environment including the first semiconductor element for a longer period of time than the annealing process that is performed under the gas environment including the first semiconductor element described above with reference to FIG. 11F. As a result, the first semiconductor element penetrates not only the first conductive capping layer 140, but also a region of the metal film 136 adjacent to the first conductive capping layer 140. As a result, the first conductive alloy capping layer 140A that includes the first semiconductor element is formed from the first conductive capping layer 140, and the second conductive alloy capping layer 236A that includes the first semiconductor element is formed from a portion of the metal film 136 at a top surface thereof. In an exemplary embodiment, the second conductive alloy capping layer 236A contacts the first conductive alloy capping layer 140A. The first semiconductor element may penetrate a region of the metal liner 134 adjacent to the first conductive capping layer 140. Thus, a portion of a top surface of the metal liner 134, which contacts the first conductive alloy capping layer 140A, may form the third conductive alloy capping layer 234A that includes the first semiconductor element.

In an exemplary embodiment, the metal film 136 is formed of Cu, the first semiconductor element is Si, and the second conductive alloy capping layer 236A is formed of an alloy including Cu and Si such as, for example, CuSi or $Cu_3Si$. In an exemplary embodiment, the metal film 136 is formed of Cu, the first semiconductor element is Ge, and the second conductive alloy capping layer 236A is formed of an alloy including Cu and Ge such as, for example, CuGe or $Cu_3Ge$.

In an exemplary embodiment, the metal liner 134 is formed of Co, the first semiconductor element is Si, and the third conductive alloy capping layer 234A is formed of an alloy including Co and Si such as, for example, CoSi, $CoSi_2$, $Co_2Si$, or $Co_3Si$. In an exemplary embodiment, the metal liner 134 is formed of Co, the first semiconductor element is Ge, and the third conductive alloy capping layer 234A is formed of an alloy including Co and Ge such as, for example, CoGe, $CoGe_2$, $CoGe_3$, $CoGe_7$, or $Co_4Ge$.

According to an exemplary embodiment, to form the first conductive alloy capping layer 140A, the second conductive alloy capping layer 236A, and the third conductive alloy capping layer 234A, the annealing process under the gas environment including the first semiconductor element may be performed at a temperature of about 300° C. to about 400° C., under pressure of about 1 torr to about 20 torr, and for a duration of about 10 seconds to about 2 minutes. However, these conditions are merely exemplary, and the inventive concept is not limited thereto.

Referring to FIG. 12B, the insulating capping layer 150, which includes the first insulating capping layer 152 and the second insulating capping layer 154, is formed over the first conductive alloy capping layer 140A, the conductive barrier film 132, and the first insulating film 124, in a manner the same as or similar to that described with reference to FIG. 11G. In an exemplary embodiment, the second conductive alloy capping layer 236A, the first conductive alloy capping layer 140A, and the insulating capping layer 150, which are sequentially formed over the metal film 136, form the complex capping layer CC2. The complex capping layer CC2 may suppress a resistance increase and a current leakage of the metal film 136, and suppress electromigration of a metal from the metal film 136.

Referring to FIG. 12C, the integrated circuit device 200 of FIG. 5 may be manufactured by performing the processes described with reference to FIG. 11H through FIG. 11J on the resulting structure of FIG. 12B.

The method described with reference to FIGS. 11A through 11J, and the method described with reference to FIGS. 12A through 12C, may be used to manufacture the integrated circuit devices 200A and 200B of FIGS. 6 and 7.

According to a method of manufacturing the integrated circuit device 200A of FIG. 6, the second hole H2 is formed according to FIG. 11I, and the first conductive alloy capping layer 140A exposed at a bottom surface of the second hole H2 is then further etched to expose the second conductive alloy capping layer 236A. The process of FIG. 11J is then performed to manufacture the integrated circuit device 200A of FIG. 6.

According to a method of manufacturing the integrated circuit device 200B of FIG. 7, the second hole H2 is formed according to FIG. 11I, and the first conductive alloy capping layer 140A exposed at a bottom surface of the second hole H2 is then etched. The second conductive alloy capping layer 236A exposed is then etched to expose the metal film 136. The process of FIG. 11J is then performed to manufacture the integrated circuit device 200B of FIG. 7.

Figure 13A:
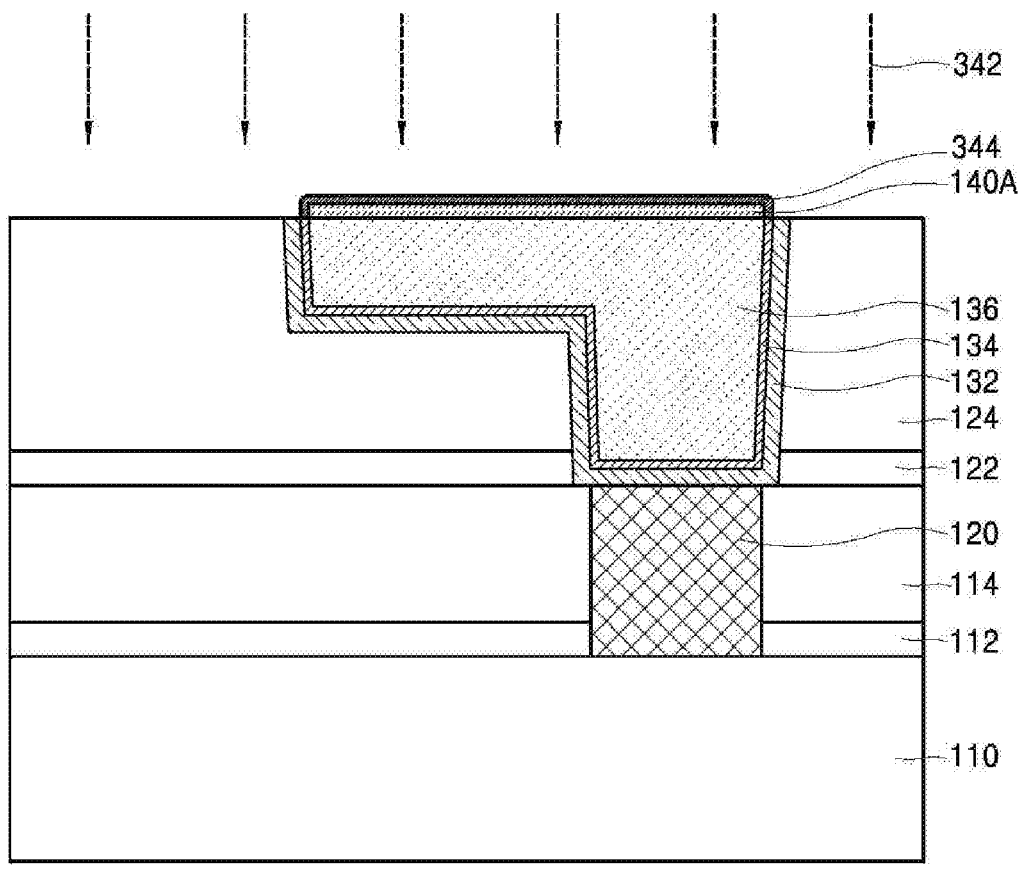
FIGS. 13A through 13C are cross-sectional views illustrating a method of manufacturing an integrated circuit device, according to an exemplary embodiment of the inventive concept.
Figure 13B:
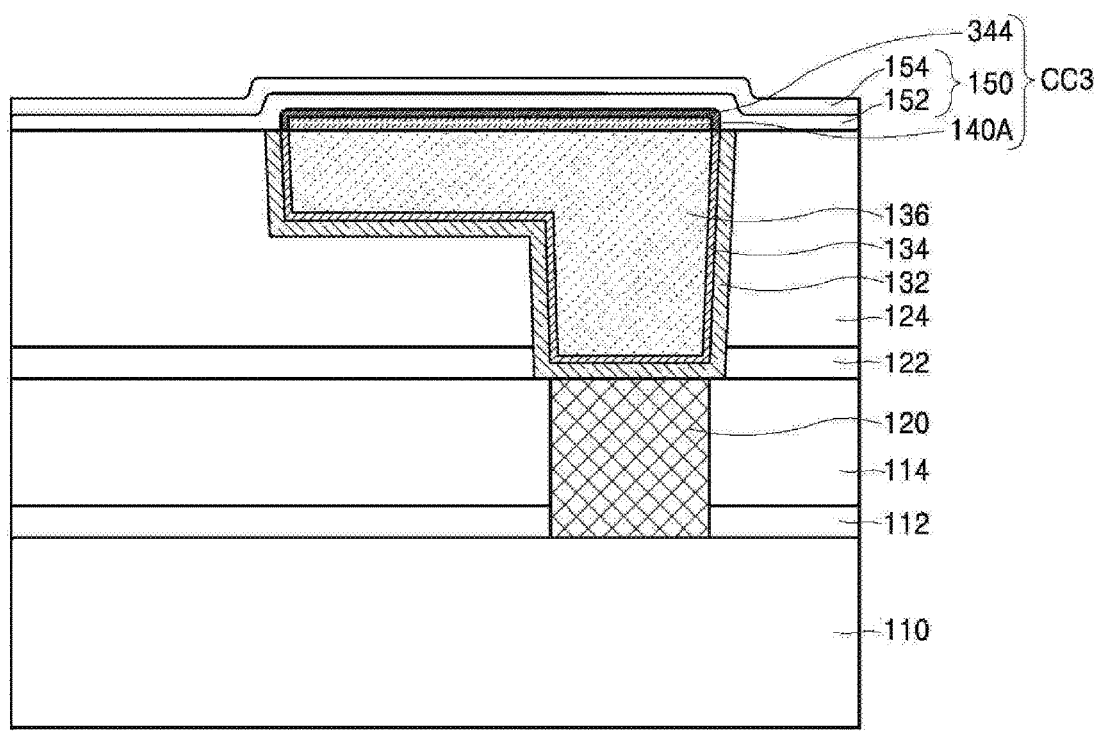
Figure 13C:
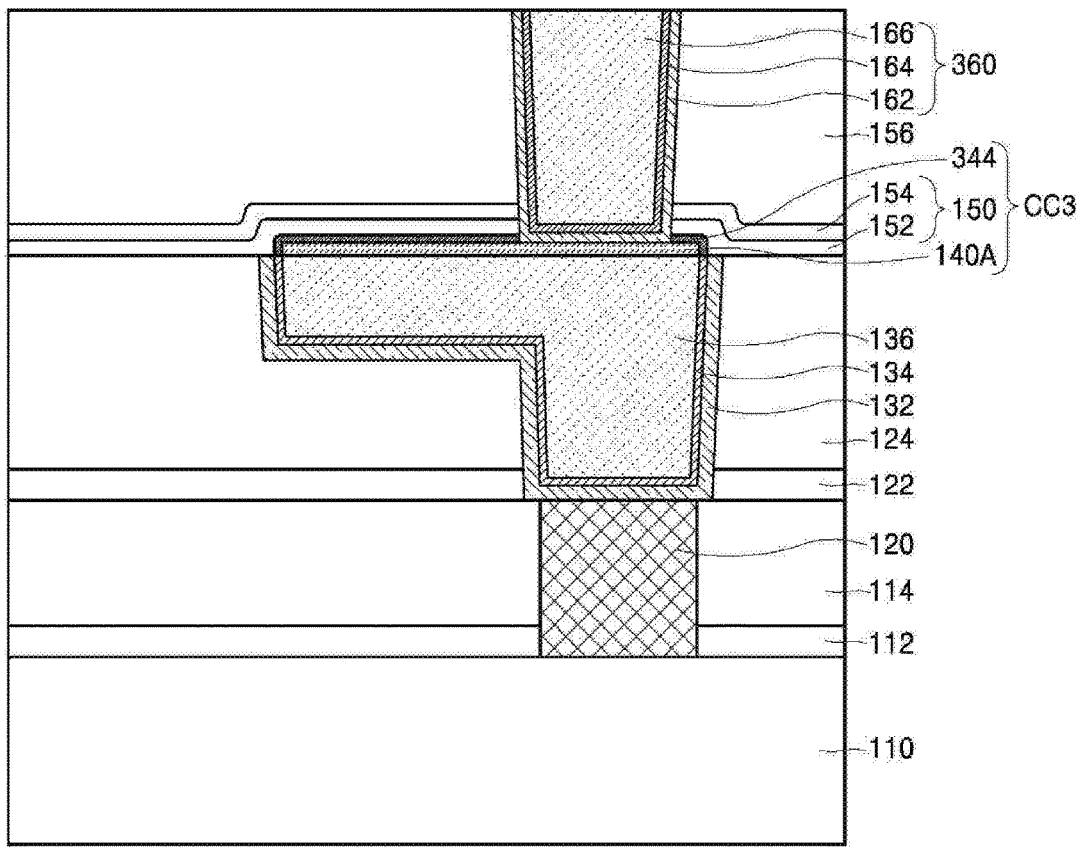

FIGS. 13A through 13C are cross-sectional views illustrating a method of manufacturing an integrated circuit device, according to an exemplary embodiment of the inventive concept. A method of manufacturing the integrated circuit device 300 of FIG. 8 will be described with reference to FIGS. 13A through 13C. A further description of elements previously described may be omitted herein.

Referring to FIG. 13A, the first conductive alloy capping layer 140A is formed on the metal film 136 over the substrate 110 by performing the processes described with reference to FIGS. 11A through 11F. The resulting structure is then annealed under a second gas environment 342 so that nitrogen atoms penetrate into a portion of the first conductive alloy capping layer 140A at an exposed surface thereof, thereby forming the nitrated alloy layer 344 on the exposed surface of the first conductive alloy capping layer 140A.

According to an exemplary embodiment, the second gas environment 342 may be a nitrogen-containing gas environment. For example, the second gas environment 342 may include $NH_3$ gas, $N_2$ gas, or a combination thereof. Other process conditions for forming the nitrated alloy layer 344 by using the second gas environment 342 are the same as or similar to those using the first gas environment 142 described with reference to FIG. 11E. In an exemplary embodiment, a plasma atmosphere may be created by applying RF power during the annealing process performed under the second gas environment 342.

Referring to FIG. 13B, the insulating capping layer 150, which includes the first insulating capping layer 152 and the second insulating capping layer 154, is formed over the nitrated alloy layer 344, the conductive barrier film 132, and the first insulating film 124 in a manner the same as or similar to that described with reference to FIG. 11G. In an exemplary embodiment, the first conductive alloy capping layer 140A, the nitrated alloy layer 344, and the insulating capping layer 150, which are sequentially formed over the metal film 136, form the complex capping layer CC3. The complex capping layer CC3 may suppress a resistance increase and a current leakage of the metal film 136, and suppress electromigration of a metal from the metal film 136.

Referring to FIG. 13C, the integrated circuit device 300 of FIG. 8 may be manufactured by performing the processes described with reference to FIG. 11H through FIG. 11J on the resulting structure of FIG. 13B.

The method described with reference to FIGS. 11A through 11J, the method described with reference to FIGS. 12A through 12C, and the method described with reference to FIGS. 13A through 13C may be used to manufacture the integrated circuit device 300A of FIG. 9. For example, according to a method of manufacturing the integrated circuit device 300A of FIG. 9, the second hole H2 exposing the nitrated alloy layer 344 may be formed in a manner the same as or similar to that described with reference to FIG. 11I. The nitrated alloy layer 344 exposed at a bottom surface of the second hole H2 may then be etched, and the first conductive alloy capping layer 140A exposed through the second hole H2 may then be etched to expose the metal film 136. The process of FIG. 11J may then be performed to manufacture the integrated circuit device 300A of FIG. 9.

According to a method of manufacturing the integrated circuit device 400 of FIG. 10, the first conductive capping layer 140 formed on the metal film 136 over the substrate 110 is annealed under the first gas environment 142 as described with reference to FIG. 12A. The first conductive capping layer 140 is then annealed under a gas environment including a first semiconductor element. As a result, the first conductive alloy capping layer 140A that includes the first semiconductor element is formed from the first conductive capping layer 140, and the second conductive alloy capping layer 236A that includes the first semiconductor element is formed from a portion of the metal film 136 at a top surface thereof. In an exemplary embodiment, the second conductive alloy capping layer 236A contacts the first conductive alloy capping layer 140A. The portion at the top surface of the metal film 136, which contacts the first conductive alloy capping layer 140A, becomes the third conductive alloy capping layer 234A that includes the first semiconductor element. As described with reference to FIG. 13A, nitrogen atoms then penetrate through the portion at an exposed surface of the first conductive alloy capping layer 140A from the second gas environment 342, forming the nitrated alloy layer 344 on the exposed surface of the first conductive alloy capping layer 140A. The processes described with reference to FIGS. 11G through 11J are then performed to manufacture the integrated circuit device 400 of FIG. 10.

Figure 14:
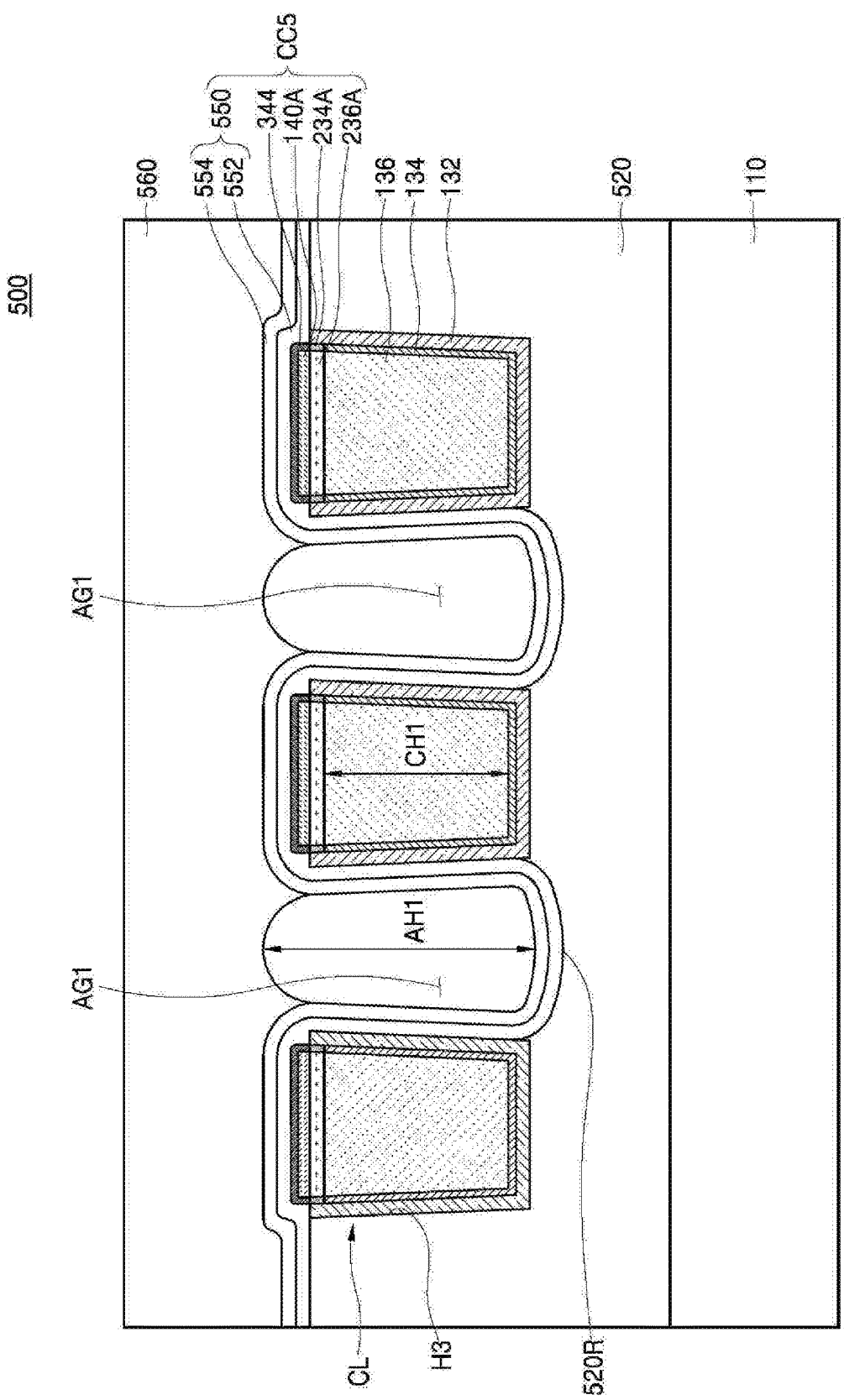
FIGS. 14 and 15 are cross-sectional views of components of integrated circuit devices, according to exemplary embodiments of the inventive concept.

FIG. 14 is a cross-sectional view of components of an integrated circuit device 500, according to an exemplary embodiment of the inventive concept. A further description of elements previously described may be omitted herein.

Referring to FIG. 14, the integrated circuit device 500 includes a lower interlayer insulating film 520 formed on the substrate 110, a plurality of conductive layers CL that penetrate at least a portion of the lower interlayer insulating film 520, and an upper interlayer insulating film 560 that extends over the lower interlayer insulating film 520 and the plurality of conductive layers CL. The upper interlayer insulating film 560 defines an upper limit of air gaps AG1 that are respectively disposed between two neighboring conductive layers CL from among the plurality of conductive layers CL.

The lower interlayer insulating film 520 includes a plurality of recessed regions 520R that are respectively disposed between the plurality of conductive layers CL. According to an exemplary embodiment, bottom surfaces of the plurality of recessed regions 520R are disposed at a lower level than lower surfaces of the plurality of conductive layers CL, such that they are closer to the substrate 110 as compared to the plurality of conductive layers CL. According to an exemplary embodiment, the bottom surfaces of the plurality of recessed regions 520R are disposed at a higher level than the lower surfaces of the plurality of conductive layers CL, such that they are further from the substrate 110 as compared to the plurality of conductive layers CL.

Each of the plurality of conductive layers CL includes the metal film 136 that includes a first metal, the conductive barrier film 132 that surrounds a bottom surface and a side wall of the metal film 136, and a complex capping layer CC5 that covers a top surface of the metal film 136. In an exemplary embodiment, the metal liner 134 is disposed between the conductive barrier film 132 and the metal film 136. In an exemplary embodiment, the conductive barrier film 132, the metal liner 134, and the metal film 136 are formed in a plurality of third holes H3 that penetrate at least a portion of the lower interlayer insulating film 520.

A structure of the complex capping layer CC5 has substantially the same structure as the complex capping layer CC4 described with reference to FIG. 10. However, unlike the complex capping layer CC4 of FIG. 10, the complex capping layer CC5 includes an insulating capping layer 550 that covers a top surface and a side wall of the metal film 136. The insulating capping layer 550 extends to conformally cover the nitrated alloy layer 344 and the conductive barrier film 132 of the conductive layer CL, a top surface of the lower interlayer insulating film 520, and a surface of the lower interlayer insulating film 520 which defines the recessed regions 520R. In an exemplary embodiment, the insulating capping layer 550 is exposed inside the air gaps AG1, and a size of each of the air gaps AG1 (e.g., a vertical length AH1) is defined by the insulating capping layer 550. According to an exemplary embodiment, the vertical length AH1 of the air gaps AG1 is greater than a vertical length CH1 of the conductive layers CL adjacent to the air gaps AG1. For example, in an exemplary embodiment, the length of the air gaps AG1 in a direction extending from the substrate 110 to the upper interlayer insulating film 560 is greater than the length of the conductive layers CL in the direction extending from the substrate 110 to the upper interlayer insulating film 560.

In an exemplary embodiment, the insulating capping layer 550 has a multilayered structure that includes a first insulating capping layer 552, which includes a metal, and a second insulating capping layer 554, which does not include a metal. In an exemplary embodiment, the insulating capping layer 550 includes a portion extending along a side wall of the conductive barrier film 132, and between two neighboring conductive layers CL from among the plurality of conductive layers CL and one of the air gaps AG1 disposed between the two neighboring conductive layers CL. In an exemplary embodiment, the insulating capping layer 550 includes a portion covering a side wall of the first conductive alloy capping layer 140A, between two neighboring conductive layers CL and one of the air gaps AG1 between the two neighboring conductive layers CL. In an exemplary embodiment, the insulating capping layer 550 includes a portion that extends to a level lower than a lower limit of the air gap AG1. For example, in an exemplary embodiment, the insulating capping layer 550 includes a portion that is closer to the substrate 110 compared to the air gap AG1. Details regarding the first insulating capping layer 552 and the second insulating capping layer 554 are the same as or similar to those regarding the first insulating capping layer 152 and the second insulating capping layer 154 described above with reference to FIG. 1.

In an exemplary embodiment, the lower interlayer insulating film 520 and the upper interlayer insulating film 560 are each an ultra-low K (ULK) film having an ultra-low dielectric constant K from about 2.2 to about 2.4, for example, a SiOC film or a SiCOH film. According to an exemplary embodiment, the lower interlayer insulating film 520 and the upper interlayer insulating film 560 include an inorganic polymer such as, for example, fluorine-doped silicon oxide (F—$SiO_2$), porous silicon oxide, a spin-on organic polymer, hydrogen silsesquioxane (HSSQ), or methyl silsesquioxane (MSSQ).

Figure 15:
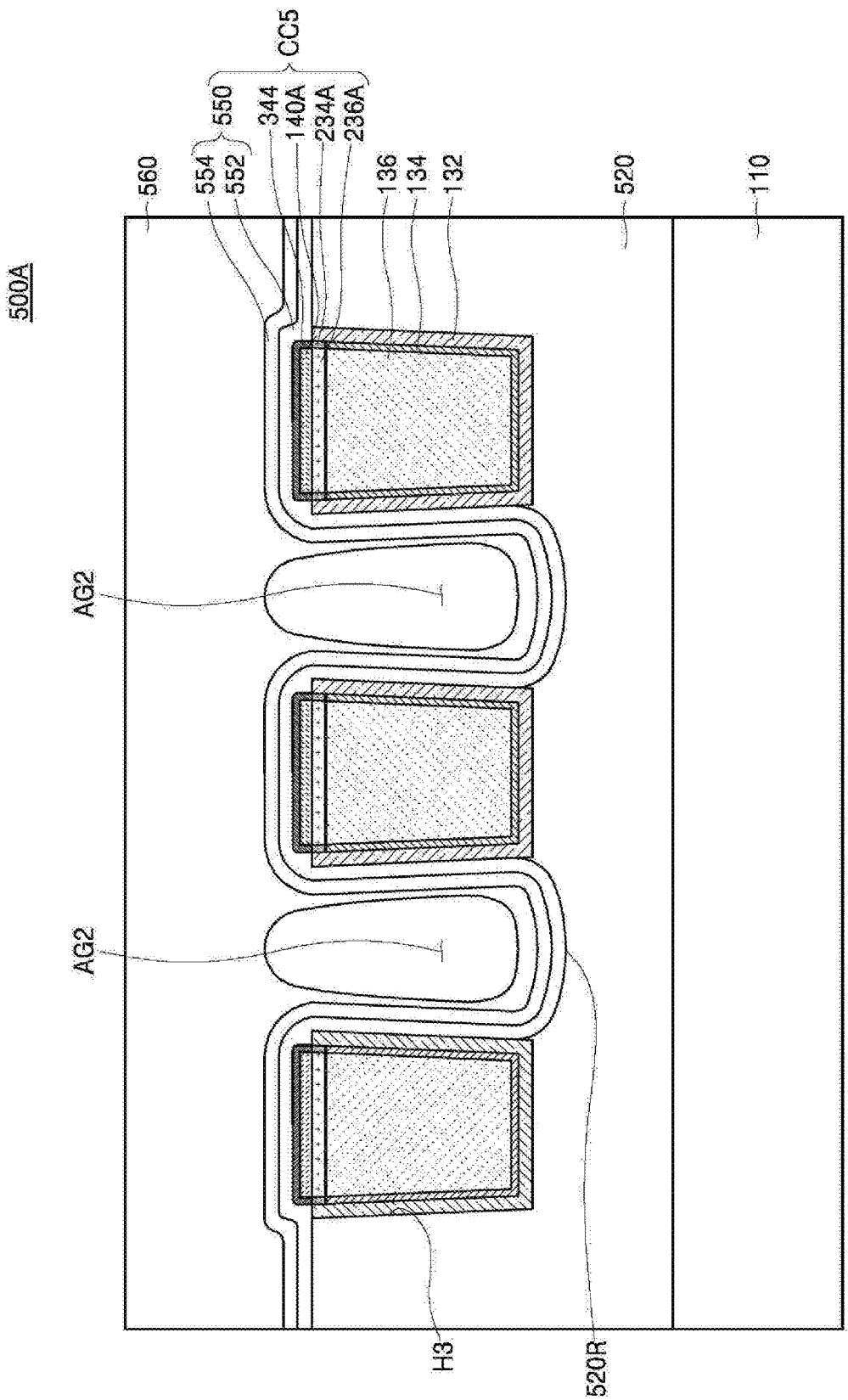

FIG. 15 is a cross-sectional view of components of an integrated circuit device 500A, according to an exemplary embodiment of the inventive concept. A further description of elements previously described may be omitted herein.

Referring to FIG. 15, a structure of the integrated circuit device 500A has substantially the same structure as the integrated circuit device 500 of FIG. 14. However, in the integrated circuit device 500A, air gaps AG2 that are each surrounded by the upper interlayer insulating film 560 and between two neighboring metal films 136 from among the plurality of metal films/layers 136 are formed. The insulating capping layer 550 is not exposed inside the air gaps AG2. For example, unlike the integrated circuit device 500 of FIG. 14, a portion of the upper interlayer insulating film 560 is disposed between the air gaps AG2 and the insulating capping layer 550.

In the integrated circuit devices 500 and 500A in FIGS. 14 and 15, the metal film 136 is covered by the complex capping layer CC5, which includes the second conductive alloy capping layer 236A, the first conductive alloy capping layer 140A, the nitrated alloy layer 344, and the insulating capping layer 550, which are sequentially formed on the metal film 136. The complex capping layer CC5 may suppress a resistance increase and a current leakage of the metal film 136, and suppress electromigration of a metal from the metal film 136. As a result, reliability of a wiring structure that includes the metal film 136 may be improved. Further, since each of the air gaps AG1 are disposed between two neighboring conductive layers CL of the plurality of conductive layers CL, undesired parasitic capacitance between the two neighboring conductive layers CL may be reduced.

FIGS. 16A through 16E are cross-sectional views illustrating a method of manufacturing an integrated circuit device, according to an exemplary embodiment of the inventive concept. A method of manufacturing the integrated circuit device 500 of FIG. 14 will be described with reference to FIGS. 16A through 16E. A further description of elements previously described may be omitted herein.

Figure 16A:
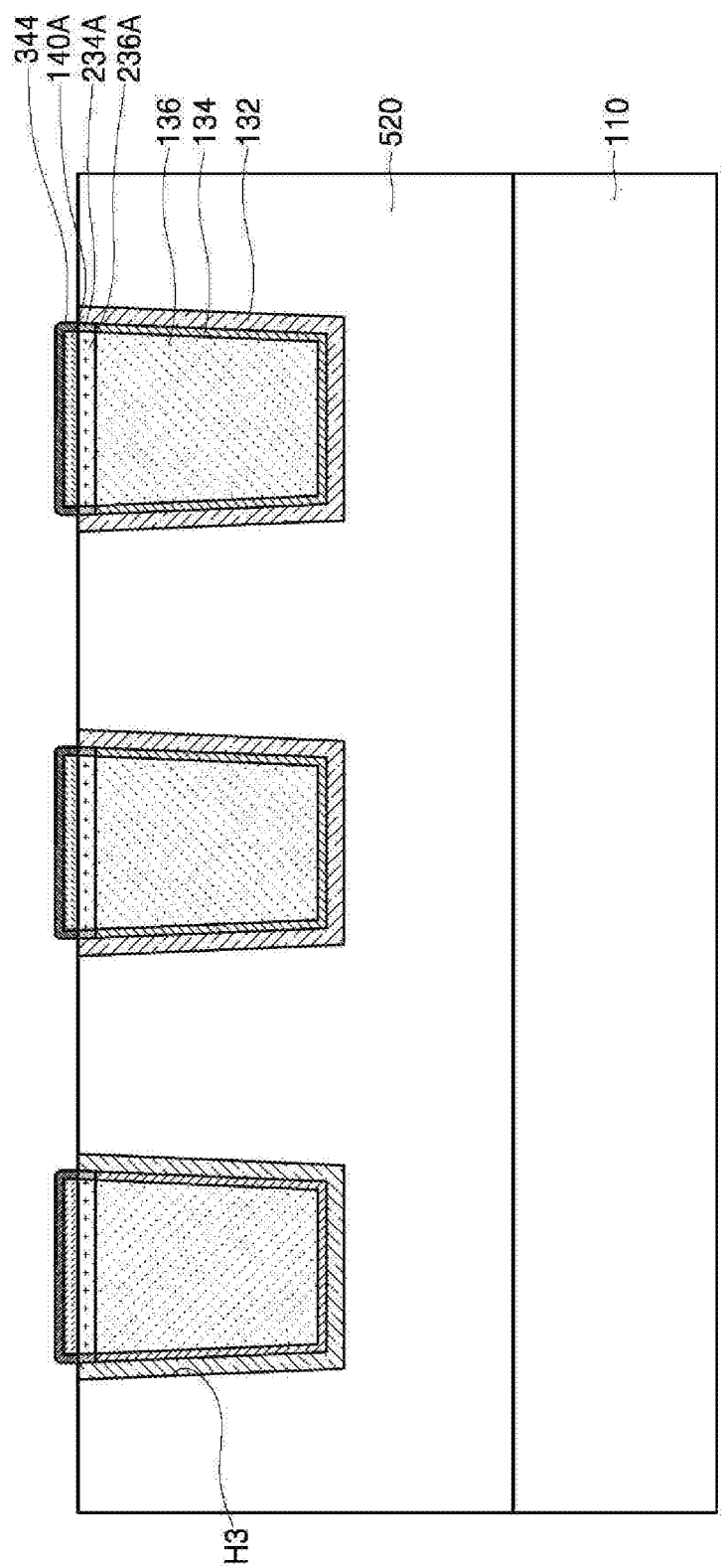

Referring to FIG. 16A, the lower interlayer insulating film 520 is formed on the substrate 110, and the plurality of third holes H3 that penetrate at least a portion of the lower interlayer insulating film 520 are then formed. In the exemplary embodiment of FIGS. 16A through 16E, the each of the plurality of third holes H3 has a blind hole form that penetrates only a portion of the total thickness of the lower interlayer insulating film 520. However, the inventive concept is not limited thereto. For example, the plurality of third holes H3 may completely penetrate the lower interlayer insulating film 520. The lower interlayer insulating film 520 may be a part of a back end of line (BEOL) structure of the integrated circuit device 500 of FIG. 14.

The processes described with reference to FIGS. 11A through 11D are then performed to form the first conductive capping layer 140 on the metal film 136 over the substrate 110. The process described with reference to FIG. 1E is then performed to anneal the first conductive capping layer 140 under the first gas environment 142, and the process described with reference to FIG. 11F is then performed to anneal the first conductive capping layer 140 under the gas environment that includes the first semiconductor element. As a result, the first conductive alloy capping layer 140A that includes the first semiconductor element is formed from the first conductive capping layer 140. However, in the exemplary embodiment of FIGS. 16A through 16E, the annealing process is performed under the gas environment that includes the first semiconductor element for a longer period of time than the annealing process performed under the gas environment that includes the first semiconductor element described with reference to FIG. 11F. As a result, the first semiconductor element penetrates not only the first conductive capping layer 140, but also penetrates a region of the metal film 136 adjacent to the first conductive capping layer 140. As a result, the first conductive alloy capping layer 140A that includes the first semiconductor element is formed from the first conductive capping layer 140, and the second conductive alloy capping layer 236A that includes the first semiconductor element is formed from a portion at a top surface of the metal film 136 which contacts the first conductive alloy capping layer 140A. In an exemplary embodiment, a portion at the top surface of the metal liner 134, which contacts the first conductive alloy capping layer 140A, forms the third conductive alloy capping layer 234A. The process described with reference to FIG. 13A is then performed. As a result, nitrogen atoms penetrate into a portion at an exposed surface of the first conductive alloy capping layer 140A from the second gas environment 342, thereby forming the nitrated alloy layer 344 on the exposed surface of the first conductive alloy capping layer 140A.

Referring to FIG. 16B, a mask pattern 530 is formed that covers a plurality of wiring structures, including the plurality of metal films 136, that fill the plurality of third holes H3. The mask pattern 530 has a plurality of openings 530H that expose local regions of the lower interlayer insulating film 520 between the plurality of third holes H3. The local regions of the lower interlayer insulating film 520 refer to portions of the lower interlayer insulating film 520 that are not covered by the mask pattern 530.

Referring to FIG. 16C, the local regions of the lower interlayer insulating film 520, which are exposed through the plurality of openings 530H, are removed to form the plurality of recessed regions 520R of the lower interlayer insulating film 520. In an exemplary embodiment, the plurality of conductive barrier films 132 are exposed inside the plurality of recessed regions 520R.

According to an exemplary embodiment, the local regions of the lower interlayer insulating film 520, which are exposed through the plurality of openings 530H, may be damaged by using, for example, an ashing process so as to form the plurality of recessed regions 520R. The damaged local regions of the lower interlayer insulating film 520 may then be removed via, for example, a wet-etching process. A dilute hydrofluoric acid (HF) etchant may be used during the wet-etching process.

According to an exemplary embodiment, to form the plurality of recessed regions 520R, the local regions of the lower interlayer insulating film 520, which are exposed through the plurality of openings 530H, may be removed via, for example, a dry-etching process using a plasma method using fluorine radicals.

Figure 16D:
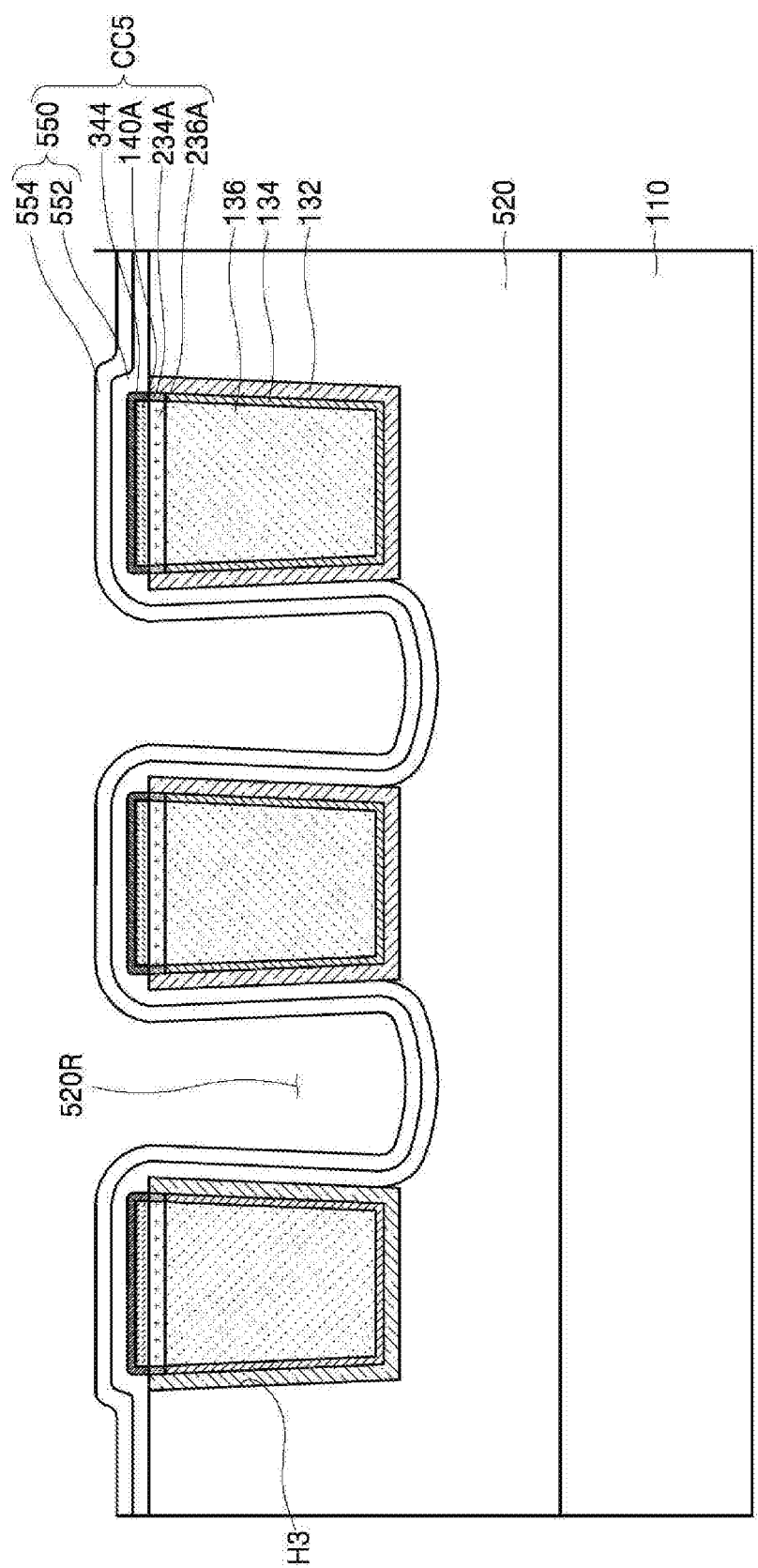

Referring to FIG. 16D, after the mask pattern 530 (see FIG. 16C) is removed, the insulating capping layer 550 that conformally covers the nitrated alloy layer 344, a top surface of the lower interlayer insulating film 520, and surfaces of the conductive barrier film 132 and lower interlayer insulating film 520, which are exposed through the recessed region 520R, is formed in a manner the same as or similar to that in which the insulating capping layer 150 described with reference to FIG. 11G is formed.

In an exemplary embodiment, the insulating capping layer 550 has a multilayered structure that includes the first insulating capping layer 552, which includes a metal, and the second insulating capping layer 554, which does not include a metal. Details regarding the formation of the first and second insulating capping layers 552 and 554 have been described above with respect to the formation of the first and second insulating capping layers 152 and 154 with reference to FIG. 11G.

By conformally forming the insulating capping layer 550 along inner walls of the plurality of recessed regions 520R, a remaining space of the recessed regions 520R may be defined by the insulating capping layer 550 between two neighboring metal films 136.

In an exemplary embodiment, the second conductive alloy capping layer 236A, the first conductive alloy capping layer 140A, the nitrated alloy layer 344, and the insulating capping layer 550, which are sequentially formed on the plurality of metal films 136, form the complex capping layer CC5. The complex capping layer CC5 may suppress a resistance increase and a current leakage of the metal film 136, and suppress electromigration of a metal from the metal film 136.

Figure 16E:
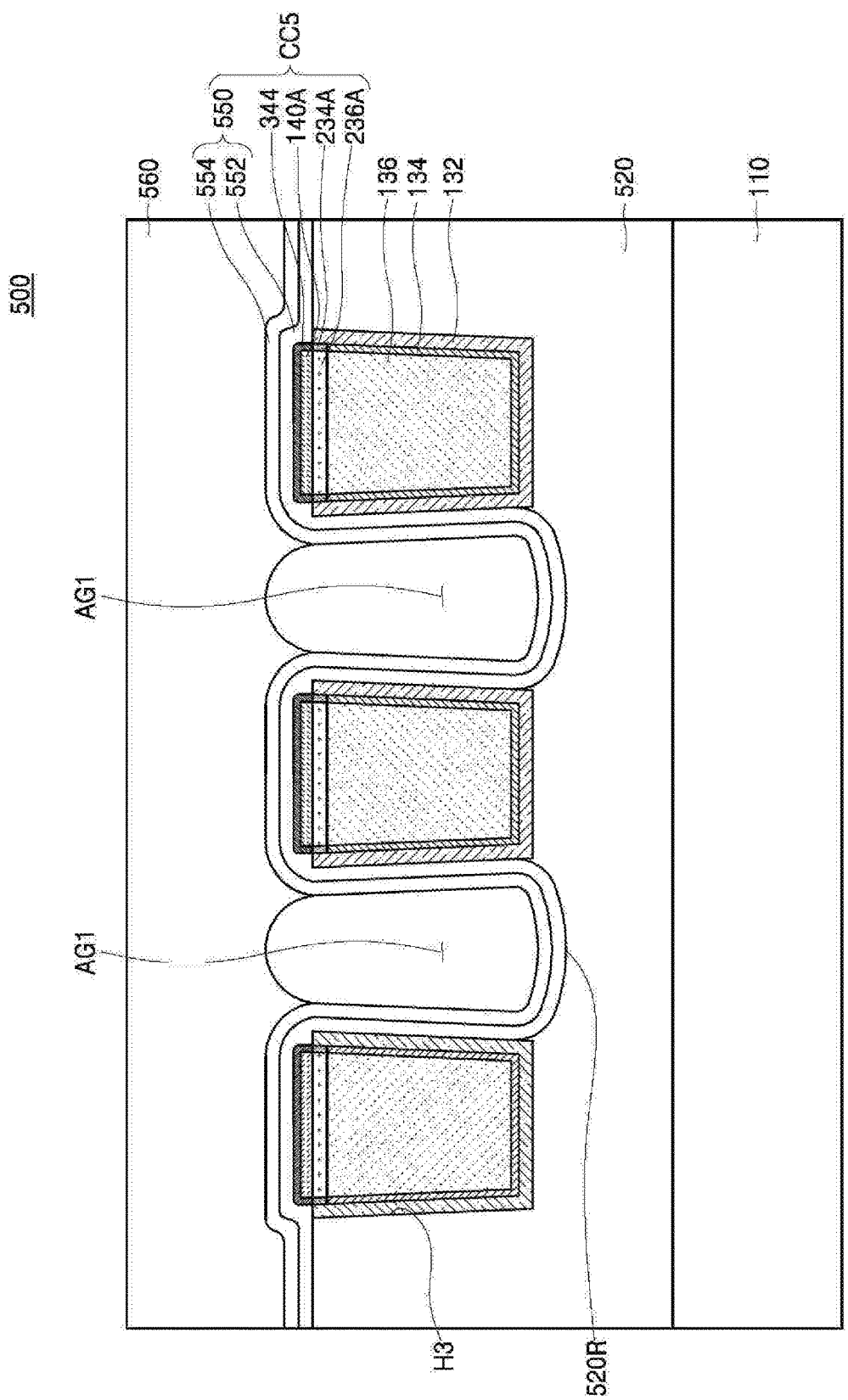

Referring to FIG. 16E, the air gap AG1 is maintained in each of the plurality of recessed regions 520R by forming the upper interlayer insulating film 560 over the insulating capping layer 550 under deposition conditions that provide a relatively low gap-fill characteristic.

During a deposition process performed to form the upper interlayer insulating film 560, a step-coverage characteristic of a deposited insulating material may be controlled as desired by changing process conditions so as to form air gaps having various forms and having different cross-sectional forms from the air gap AG1. For example, during the deposition process performed to form the upper interlayer insulating film 560, the step-coverage characteristic of the deposited insulating material may be controlled so as to form the air gaps AG2 surrounded by the upper interlayer insulating film 560, as shown in FIG. 15. The upper interlayer insulating film 560 may be formed of the same material as the lower interlayer insulating film 520.

In exemplary embodiments, a conductive contact plug electrically connected to one of the plurality of metal films 136 that penetrate the upper interlayer insulating film 560 and the insulating capping layer 550 is formed.

Figure 17A:
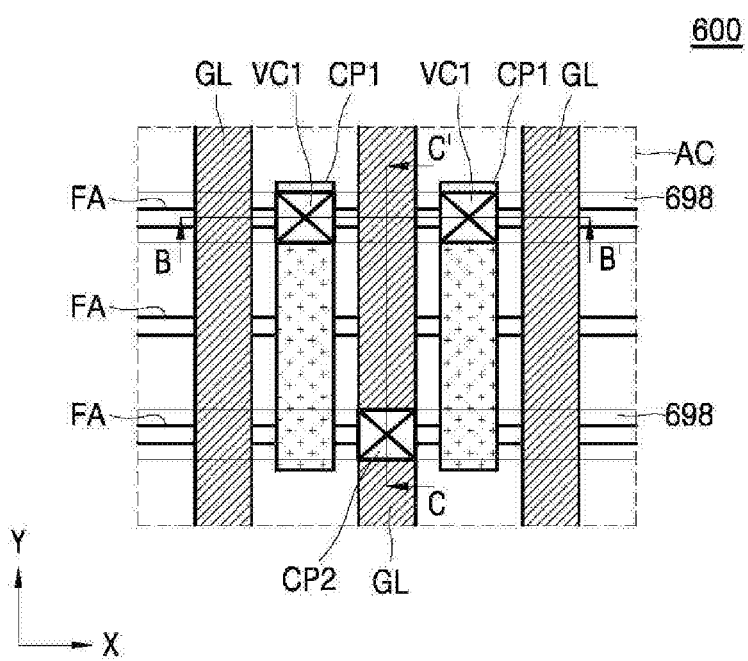
FIG. 17A is a layout diagram of components of an integrated circuit device, according to an exemplary embodiment of the inventive concept.
Figure 17B:
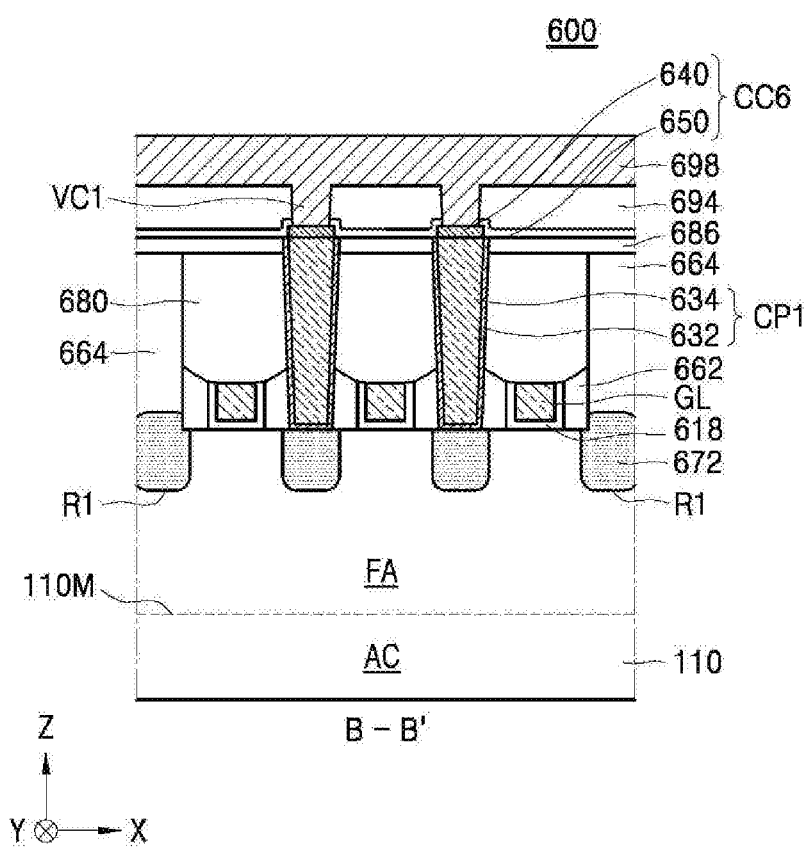
FIG. 17B is a cross-sectional view taken along line B-B' of FIG. 17A, according to an exemplary embodiment of the inventive concept.
Figure 17C:
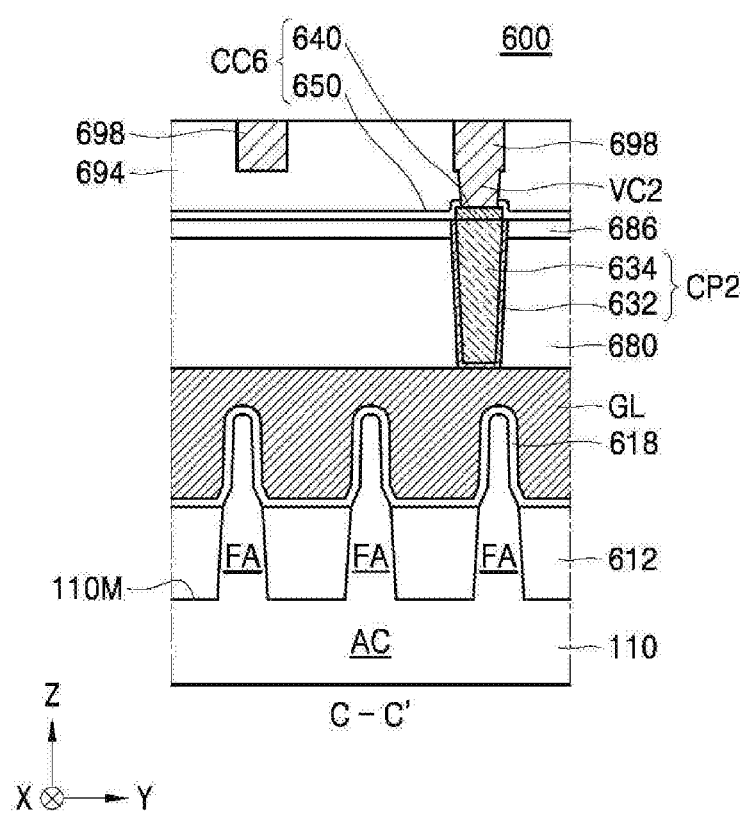
FIG. 17C is a cross-sectional view taken along line C-C' of FIG. 17A, according to an exemplary embodiment of the inventive concept.

FIGS. 17A through 17C are views illustrating an integrated circuit device 600 according to an exemplary embodiment of the inventive concept. FIG. 17A is a layout diagram of components of the integrated circuit device 600, FIG. 17B is a cross-sectional view taken along line B-B' of FIG. 17A, and FIG. 17C is a cross-sectional view taken along line C-C' of FIG. 17A. The integrated circuit device 600 of FIGS. 17A through 17C may form, for example, a logic cell including a fin-field effect transistor (FinFET). A further description of elements previously described may be omitted herein.

Referring to FIGS. 17A through 17C, the substrate 110 having a main surface 110M extending in a horizontal direction (X- and Y-directions) includes a device active region AC. A plurality of fin-type active regions FA protrude from the device active region AC of the substrate 110. The plurality of fin-type active regions FA may extend in parallel to each other along one direction (the X-direction). A lower side wall of each of the plurality of fin-type active regions FA is covered by an isolation insulating film 612 on the device active region AC.

A plurality of gate insulating films 618 and a plurality of gate lines GL extend in a direction (the Y-direction) crossing the plurality of fin-type active regions FA over the substrate 110. The plurality of gate insulating films 618 and the plurality of gate lines GL may extend while covering a top surface and two side walls of each of the plurality of fin-type active regions FA. A plurality of metal-oxide semiconductor (MOS) transistors may be formed along the plurality of gate lines GL over the device active region AC. The plurality of MOS transistors may each be a 3-dimensional (3D) MOS transistor forming a channel on the top surface and the two side walls of each of the fin-type active regions FA.

The plurality of gate insulating films 618 may each be a silicon oxide film, a high dielectric film, or a combination thereof. The high dielectric film may be formed of a metal oxide having a higher dielectric constant than the silicon oxide film. An interface layer may be disposed between the fin-type active regions FA and the gate insulating film 618. The interface layer may be formed of an insulating material such as, for example, an oxide, a nitride, or an oxynitride.

The gate line GL may include a work function metal-containing layer and a gap-fill metal film. The work function metal-containing layer may include at least one metal selected from among Ti, W, Ru, Nb, Mo, Hf, Ni, Co, Pt, Yb, Tb, Dy, Er, or Pd. The gap-fill metal film may be, for example, a W film or an Al film. According to an exemplary embodiment, the plurality of gate lines GL may each have a stacked structure of, for example, TiAlC/TiN/W, TiN/TaN/TiAlC/TiN/W, or TiN/TaN/TiN/TiAlC/TiN/W.

Two side walls of the gate line GL may be covered by an insulating spacer 662. The insulating spacer 662 may include, for example, a silicon nitride film, a SiCON film, a SiCN film, or a combination thereof. An inter-gate insulating film 664 may be formed in a space between the gate lines GL. The inter-gate insulating film 664 may include, for example, a silicon oxide film.

A plurality of gate capping layers 680 are formed over the plurality of gate lines GL. The gate capping layer 680 and the inter-gate insulating film 664 may be covered by an insulating liner 686. The gate capping layer 680 and the insulating liner 686 may include, for example, a silicon nitride film. In an exemplary embodiment, the insulating liner 686 may be omitted.

A plurality of source/drain regions 672 may be formed on two sides of each of the plurality of gate lines GL, over the plurality of fin-type active regions FA. The plurality of source/drain regions 672 may include a semiconductor epitaxial layer such as, for example, an epitaxially grown Si layer, an epitaxially grown SiC layer, or an epitaxially grown SiGe layer, which is epitaxially grown from a plurality of recessed regions RI formed in the fin-type active region FA. A region of the plurality of source/drain regions 672 may be covered by the inter-gate insulating film 664.

A plurality of first conductive plugs CP1 connected to the plurality of source/drain regions 672 are formed over the plurality of fin-type active regions FA. As shown in FIG. 17A, the plurality of first conductive plugs CP1 may each extend in a direction crossing the plurality of fin-type active regions FA.

A second conductive plug CP2 is formed over at least one of the plurality of gate lines GL. The second conductive plug CP2 may be connected to the gate line GL by penetrating the insulating liner 686 and the gate capping layer 680.

The plurality of first conductive plugs CP1 and the second conductive plug CP2 may each have a stacked structure of a conductive barrier film 632 and a metal film 634. The conductive barrier film 632 may include, for example, Ta, TaN, Ti, TiN, or a combination thereof. The metal film 634 may include, for example, W or Cu. A top surface of each of the plurality of first conductive plugs CP1 and the second conductive plug CP2 may be covered by an alloy capping layer 640. The alloy capping layer 640 may include the first conductive alloy capping layer 140A described with reference to FIG. 1, the second conductive alloy capping layer 236A described with reference to FIG. 5, the nitrated alloy layer 344 described with reference to FIG. 8, or a combination thereof. The integrated circuit device 600 may include an insulating capping layer 650 covering the insulating liner 686 and a plurality of alloy capping layers 640. The structure of the insulating capping layer 650 may be substantially the same as the structure of the insulating capping layer 150 described with reference to FIG. 1.

The alloy capping layer 640 and the insulating capping layer 650, which are sequentially formed on the plurality of metal films 634 forming the plurality of first conductive plugs CP1 and the second conductive plug CP2, may form a complex capping layer CC6. The complex capping layer CC6 may suppress a resistance increase and a current leakage of the metal film 634, and suppress electromigration of a metal from the metal film 634.

An upper insulating film 694 may be formed over the insulating capping layer 650, and the integrated circuit device 600 may further include a plurality of first conductive via contacts VC1 electrically connected to the plurality of first conductive plugs CP1 by penetrating the upper insulating film 694 and the insulating capping layer 650. The integrated circuit device 600 may further include a second conductive via contact VC2 connected to the second conductive plug CP2 by penetrating the upper insulating film 694 and the insulating capping layer 650. The integrated circuit device 600 may further include a plurality of wiring layers 698 connected to the first and second conductive via contacts VC1 and VC2. According to an exemplary embodiment, the plurality of first conductive via contacts VC1 and partial wiring layers of the plurality of wiring layers 698 may be integrally formed. Further, the second conductive via contact VC2 and the other partial wiring layers of the plurality of wiring layers 698 may be integrally formed. Each of the first and second conductive via contacts VC1 and VC2 and plurality of wiring layers 698 may include, for example, a metal film and a conductive barrier film surrounding the metal film. The metal film may be formed of, for example, Cu, W, Co, Ru, Mn, Ti, or Ta, and the conductive barrier film may be formed of, for example, Ta, TaN, Ti, TiN, or a combination thereof.

The upper insulating film 694 may include a silicon oxide film or a low dielectric film having a low dielectric constant from about 2.7 to about 3.0, such as, for example, a SiOC film or a SiCOH film.

In the integrated circuit device 600 of FIGS. 17A through 17C, the metal film 634 is covered by the complex capping layer CC6, which includes the alloy capping layer 640 and the insulating capping layer 650, which are formed over the metal film 634. The complex capping layer CC6 may suppress a resistance increase and a current leakage of the metal film 634, and suppress electromigration of a metal from the metal film 634, thereby increasing reliability of a wiring structure including the metal film 634.

While the inventive concept has been particularly shown and described with reference to the exemplary embodiments thereof, it will be understood that various changes in form and detail may be made therein without departing from the spirit and scope of the inventive concept as defined by the following claims.

What is claimed is:

1. An integrated circuit device, comprising:
a metal film comprising a first metal and penetrating at least a portion of an insulating film formed over a substrate;
a metal liner surrounding the metal film; and
a complex capping layer covering a top surface of the metal film,
wherein the complex capping layer comprises:
a first conductive alloy capping layer comprising a first semiconductor element and a second metal different from the first metal, and covering a top surface of the metal liner;
a second conductive alloy capping layer comprising the first metal and a second semiconductor element, wherein the second conductive alloy capping layer is disposed between the metal film and the first conductive alloy capping layer; and
an insulating capping layer covering the insulating film and the first conductive alloy capping layer.

2. The integrated circuit device of claim 1, wherein the first metal is copper (Cu), tungsten (W), cobalt (Co), ruthenium (Ru), manganese (Mn), titanium (Ti), or tantalum (Ta), and
the second metal is Co, nickel (Ni), Ta, Ru, W, Mn, or a combination thereof.

3. The integrated circuit device of claim 1, wherein the first semiconductor element is at least one of silicon (Si) or germanium (Ge).

4. The integrated circuit device of claim 1, wherein the second semiconductor element is at least one of silicon (Si) or germanium (Ge).

5. The integrated circuit device of claim 1, wherein the insulating capping layer comprises:
a first insulating capping layer formed of aluminum nitride (AlN), aluminum oxynitride (AlON), aluminum oxide (AlO), or aluminum oxycarbide (AlOC); and
a second insulating capping layer formed of silicon carbide (SiC), silicon nitride (SiN), nitrogen-doped silicon carbide (SiC:N), or silicon oxycarbide (SiOC).

6. The integrated circuit device of claim 1, wherein the complex capping layer further comprises:
a nitrated alloy layer disposed between the first conductive alloy capping layer and the insulating capping layer,
wherein the nitrated alloy layer comprises the second metal, the first semiconductor element, and nitrogen atoms.

7. The integrated circuit device of claim 1, further comprising:
a conductive barrier film surrounding the metal film.

8. The integrated circuit device of claim 7, wherein the metal liner is disposed between the metal film and the conductive barrier film, and the complex capping layer further comprises:
a third conductive alloy capping layer disposed over the metal liner, and between the second conductive alloy capping layer and the conductive barrier film.

9. The integrated circuit device of claim 1, wherein the first metal is copper (Cu), the second metal is cobalt (Co), and the first semiconductor element is at least one of silicon (Si) or germanium (Ge), and
the complex capping layer further comprises a CoSiN layer or a CoGeN layer disposed between the first conductive alloy capping layer and the insulating capping layer.

10. The integrated circuit device of claim 1, further comprising:
an upper metal film penetrating at least a portion of the complex capping layer and electrically connected to the metal film.

11. An integrated circuit device, comprising:
a first insulating film formed over a substrate;
a plurality of conductive layers penetrating at least a portion of the first insulating film; and
a second insulating film formed over the first insulating film and the plurality of conductive layers;
wherein each of the plurality of conductive layers comprises:
a metal film comprising a first metal;
a conductive barrier film surrounding a bottom surface and a side wall of the metal film; and
a complex capping layer covering a top surface of the metal film and a top surface of the conductive barrier film, wherein the complex capping layer comprises:
- a first conductive alloy capping layer comprising a first semiconductor element and a second metal different from the first metal;
- a second conductive alloy capping layer comprising the first metal and a second semiconductor element, wherein the second conductive alloy capping layer is disposed between the metal film and the first conductive alloy capping layer; and
- an insulating capping layer covering the first insulating film and the first conductive alloy capping layer, wherein an air gap surrounded by the insulating capping layer and the second insulating film is disposed between two neighboring conductive layers from among the plurality of conductive layers.

12. The integrated circuit device of claim 11, wherein the insulating capping layer comprises a portion extending along a side wall of the conductive barrier film between the air gap and one of the plurality of conductive layers.

13. The integrated circuit device of claim 11, wherein the insulating capping layer comprises a portion covering a side wall of the first conductive alloy capping layer between the air gap and one of the plurality of conductive layers.

14. The integrated circuit device of claim 11, wherein the second conductive alloy capping layer is spaced apart from the air gap, and the conductive barrier film is disposed between the second conductive alloy capping layer and the air gap.

15. The integrated circuit device of claim 11, wherein the complex capping layer further comprises:
- a nitrated alloy layer disposed between the first conductive alloy capping layer and the insulating capping layer, wherein the nitrated alloy layer comprises the second metal and the first semiconductor element.

* * * * *